US011194386B1

(12) United States Patent
Zhao

(10) Patent No.: US 11,194,386 B1
(45) Date of Patent: Dec. 7, 2021

(54) ARTIFICIAL REALITY WEARABLE MAGNETIC SENSOR SYSTEM FOR BODY POSE TRACKING

(71) Applicant: Facebook Technologies, LLC, Menlo Park, CA (US)

(72) Inventor: Yi Zhao, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 146 days.

(21) Appl. No.: 16/505,328

(22) Filed: Jul. 8, 2019

Related U.S. Application Data

(60) Provisional application No. 62/868,656, filed on Jun. 28, 2019, provisional application No. 62/851,593, filed on May 22, 2019.

(51) Int. Cl.
| | |
|---|---|
| *G06F 3/01* | (2006.01) |
| *G01R 33/02* | (2006.01) |
| *G01B 7/004* | (2006.01) |
| *G01B 7/30* | (2006.01) |
| *G01D 5/12* | (2006.01) |

(52) U.S. Cl.
CPC .............. *G06F 3/011* (2013.01); *G01B 7/004* (2013.01); *G01B 7/30* (2013.01); *G01D 5/12* (2013.01); *G01R 33/0206* (2013.01); *G06F 3/017* (2013.01)

(58) Field of Classification Search
None
See application file for complete search history.

(56) References Cited

U.S. PATENT DOCUMENTS

| 10,599,217 B1* | 3/2020 | Keller ..................... G06F 3/014 |
| 2009/0278791 A1* | 11/2009 | Slycke ................... A61B 5/1114 |
| | | 345/156 |
| 2012/0158335 A1 | 6/2012 | Donovan et al. |
| 2014/0350894 A1 | 11/2014 | Yamashita et al. |

(Continued)

OTHER PUBLICATIONS

U.S. Appl. No. 62/851,593, naming inventors Zhao et al., filed May 22, 2019.

(Continued)

*Primary Examiner* — Melissa J Koval
*Assistant Examiner* — Joseph O Nyamogo
(74) *Attorney, Agent, or Firm* — Shumaker & Sieffert, P.A.

(57) ABSTRACT

A wearable magnetic sensor system includes a wearable article that spatially arranges magnetic sensor components around a user's torso to obtain magnetic sensor data used for body pose tracking. The wearable magnetic sensor system includes magnetic sensor components that sense a magnetic field generated by a magnetic transmitter. One or more wearable articles spatially arrange the magnetic sensor components at different locations on a body of the user, such as the arms and torso. The one or more wearable articles include a transmitter attachment mechanism for affixing the magnetic transmitter at, e.g., a torso of the user, and receiver attachment mechanisms for affixing the magnetic sensor components at, e.g., locations of the body other than the torso. The magnetic sensor components are spatially arranged at different locations on the user's body so as to maximize tracking accuracy and minimize interference between the magnetic sensors and the transmitter.

25 Claims, 12 Drawing Sheets

(56) References Cited

U.S. PATENT DOCUMENTS

| | | |
|---|---|---|
| 2015/0236869 A1 | 8/2015 | Vreeland et al. |
| 2016/0202755 A1* | 7/2016 | Connor .............. A41D 13/1281 73/865.4 |
| 2018/0182164 A1 | 6/2018 | Bognar et al. |
| 2018/0340804 A1* | 11/2018 | Cherkashin ............ G01D 18/00 |
| 2020/0272235 A1* | 8/2020 | Ng ........................ G01B 7/004 |
| 2020/0404994 A1* | 12/2020 | Yoon .................... A61B 5/6806 |

OTHER PUBLICATIONS

U.S. Appl. No. 16/878,504, filed May 19, 2020, naming inventors Zhao et al.

* cited by examiner

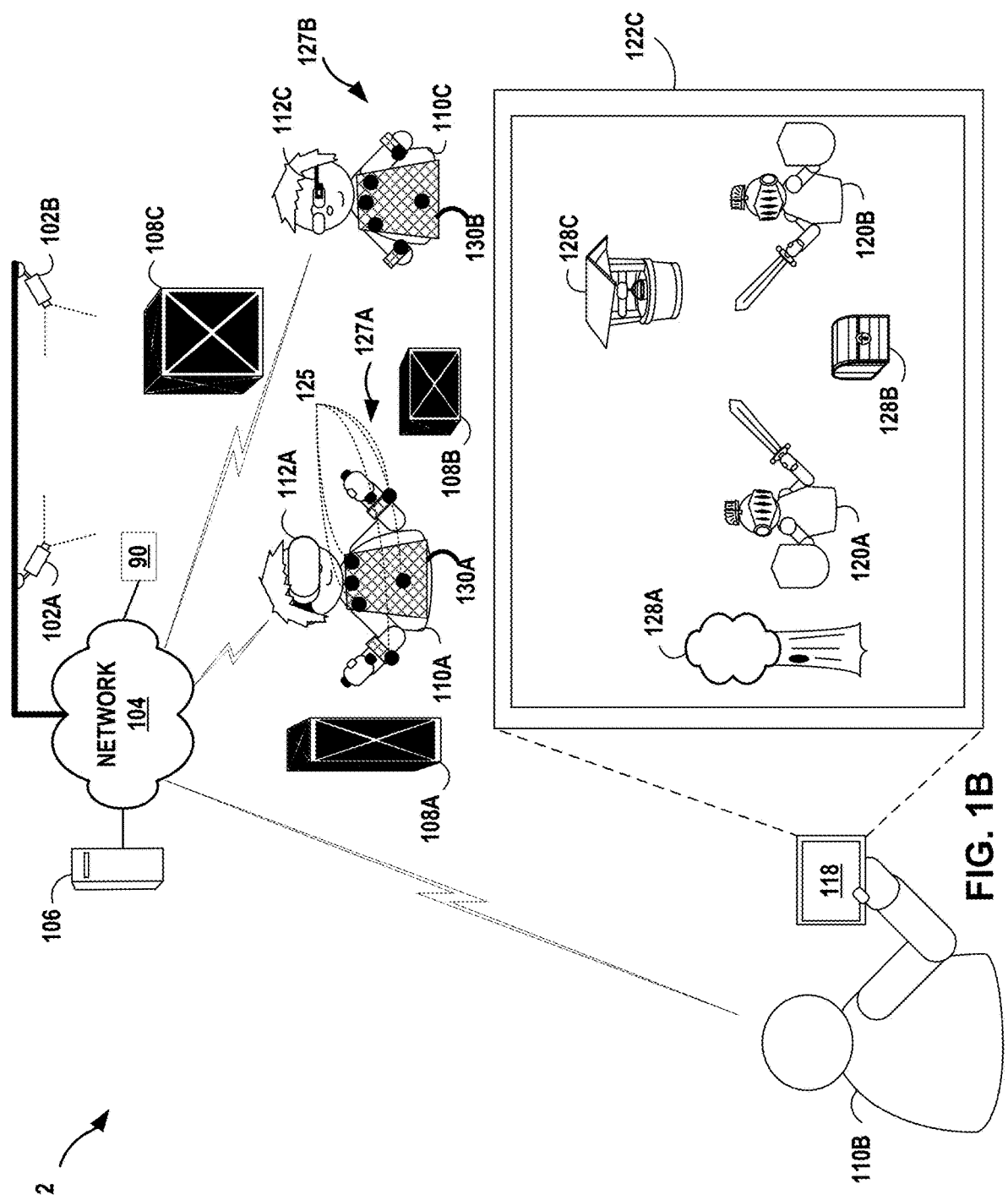

US 11,194,386 B1

ARTIFICIAL REALITY WEARABLE MAGNETIC SENSOR SYSTEM FOR BODY POSE TRACKING

This application claims the benefit of U.S. Provisional Application No. 62/851,593 by Zhao et al., entitled "MAGNETIC SENSORS FOR BODY POSE TRACKING IN ARTIFICIAL REALITY SYSTEMS," and filed on May 22, 2019 and U.S. Provisional Application No. 62/868,656 by Zhao et al., entitled "SYNCHRONIZATION OF MAGNETIC SENSOR SAMPLING FREQUENCY FOR BODY POSE TRACKING IN ARTIFICIAL REALITY SYSTEMS," and filed on Jun. 28, 2019. The entire content of Application No. 62/851,593 and Application No. 62/868,656 are incorporated herein by reference.

TECHNICAL FIELD

This disclosure generally relates to artificial reality systems, such as virtual reality, mixed reality and/or augmented reality systems, and more particularly, to body pose tracking for artificial reality systems.

BACKGROUND

Artificial reality systems are becoming increasingly ubiquitous with applications in many fields such as computer gaming, health and safety, industrial, and education. As a few examples, artificial reality systems are being incorporated into mobile devices, gaming consoles, personal computers, movie theaters, and theme parks. In general, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof.

Typical artificial reality systems include one or more devices for rendering and displaying content to users. As one example, an artificial reality system may incorporate a head-mounted display (HMD) worn by a user and configured to output artificial reality content to the user. As another example, an artificial reality system may output content for display by a tablet computer, mobile phone, or other device having a non-HMD form factor. The artificial reality content may include completely-generated content or generated content combined with captured content (e.g., real-world video and/or images).

SUMMARY

In general, this disclosure describes a wearable magnetic sensor system that includes a wearable article configured to spatially arrange a plurality of magnetic sensor components around a torso of a user. The wearable article positions the plurality of magnetic sensor components around the torso of the user such that magnetic sensor data generated by the magnetic sensor components comprises tracking data for movements of the torso of the user. In this way, the wearable magnetic sensor system described in this disclosure may provide magnetic sensor data used to perform body pose tracking in an artificial reality (AR) system. The disclosure further describes techniques for calibrating the magnetic sensor components of the wearable magnetic sensor system to improve the accuracy of body pose tracking.

In one example, the disclosure describes a wearable magnetic sensor system that includes a plurality of magnetic sensor components that sense a magnetic field generated by a magnetic transmitter for performing body pose tracking. In some examples, the plurality of magnetic sensor components are included in one or more wearable articles (e.g., a vest, a shirt, a jacket, arm bands, wrist bands, and/or chest bands) that spatially arrange the plurality of magnetic sensor components at different locations on a body of the user, such as the user's arms and torso. The one or more wearable articles include a transmitter attachment mechanism for affixing the magnetic transmitter at a location on a torso of the user, and a plurality of receiver attachment mechanisms for affixing the magnetic sensor components at different locations around the torso of the user. The plurality of magnetic sensor components are spatially arranged within one or more wearable articles so as to maximize tracking accuracy and minimize interference between the magnetic sensors, the transmitter, and a power source for the wearable articles. Each wearable article may comprise a relatively rigid structure that stabilizes the magnetic sensor components without inhibiting movement by the user. In addition, each wearable article may be constructed to hold the components of the magnetic sensor system on the user's body with appropriate weight distribution to facilitate user comfort.

In one example, the disclosure describes magnetic sensor calibration techniques for accurate body pose tracking in AR systems. The calibration techniques include intrinsic calibration of magnetic data and intrinsic calibration of inertial measurement unit (IMU) data for each magnetic sensor component using distortion and noise modeling that varies according to a location of each magnetic sensor component on the user's body. The calibration techniques also include fusion of the multi-sensor data, i.e., magnetic and IMU data, to provide high accuracy results and noise tolerance. In addition, the calibration techniques include sensor-to-camera system calibration to integrate the magnetic sensor components into a field of view (FoV) of an image capture device and optic ground truth system calibration. In some examples, sensor-to-skeleton calibration may be performed to enhance body pose tracking accuracy by determining the exact location of each of the magnetic sensor components with respect to the skeleton or joints of an individual user's body.

In one example, the techniques of the disclosure describe a wearable magnetic sensor system comprising: a wearable article configured to be worn around a torso of a user; a magnetic transmitter configured to generate a magnetic field; and a plurality of magnetic sensor components, wherein each magnetic sensor component of the plurality of magnetic sensor components comprises a magnetic sensor configured to generate magnetic sensor data based on the magnetic field sensed at the magnetic sensor and wirelessly transmit the magnetic sensor data to a computing device, wherein the wearable article includes a transmitter attachment mechanism configured to affix the magnetic transmitter at a location on the torso of the user, and wherein the wearable article includes a plurality of receiver attachment mechanisms spatially arranged within the wearable article to affix each magnetic sensor component of the plurality of magnetic sensor components at respective different locations around the torso of the user.

In another example, the techniques of the disclosure describe a wearable magnetic sensor system comprising: a wearable article configured to be worn around a torso of a user; a magnetic transmitter configured to generate a magnetic field; a plurality of magnetic sensor components, wherein each magnetic sensor component of the plurality of magnetic sensor components comprises a magnetic sensor configured to generate magnetic sensor data based on the magnetic field sensed at the magnetic sensor and wirelessly transmit the magnetic sensor data to a computing device, wherein the wearable article includes a transmitter attachment mechanism configured to affix the magnetic transmitter at a location on the torso of the user, wherein the wearable article includes a plurality of receiver attachment mechanisms spatially arranged within the wearable article to affix each magnetic sensor component of the plurality of magnetic sensor components at respective different locations around the torso of the user; and a pose tracker configured to compute a body pose of the user based on the magnetic sensor data of each magnetic sensor component of the plurality of magnetic sensor components.

In another example, the techniques of the disclosure describe a method comprising: generating, by a magnetic transmitter of a wearable magnetic sensor system, a magnetic field, wherein the wearable magnetic sensor system comprises a wearable article configured to be worn around a torso of a user, and wherein the wearable article includes a transmitter attachment mechanism configured to affix the magnetic transmitter at a location on the torso of the user; generating, by a magnetic sensor of each magnetic sensor component of a plurality of magnetic sensor components, magnetic sensor data based on the magnetic field sensed at the magnetic sensor, wherein the wearable article includes a plurality of receiver attachment mechanisms spatially arranged within the wearable article to affix each magnetic sensor component of the plurality of magnetic sensor components at respective different locations around the torso of the user; wirelessly transmitting, by the magnetic sensor, the magnetic sensor data to a computing device; and computing, by a pose tracker, a body pose of the user based on the magnetic sensor data of each magnetic sensor component of the plurality of magnetic sensor components.

The details of one or more examples of the techniques of this disclosure are set forth in the accompanying drawings and the description below. Other features, obj, and advantages of the techniques will be apparent from the description and drawings, and from the claims.

BRIEF DESCRIPTION OF DRAWINGS

FIG. 1B is an illustration depicting another example artificial reality system that that performs magnetic sensor-based body pose tracking of a user, in accordance with the techniques of the disclosure.

Like reference characters refer to like elements throughout the figures and description.

DETAILED DESCRIPTION

Figure 1A:
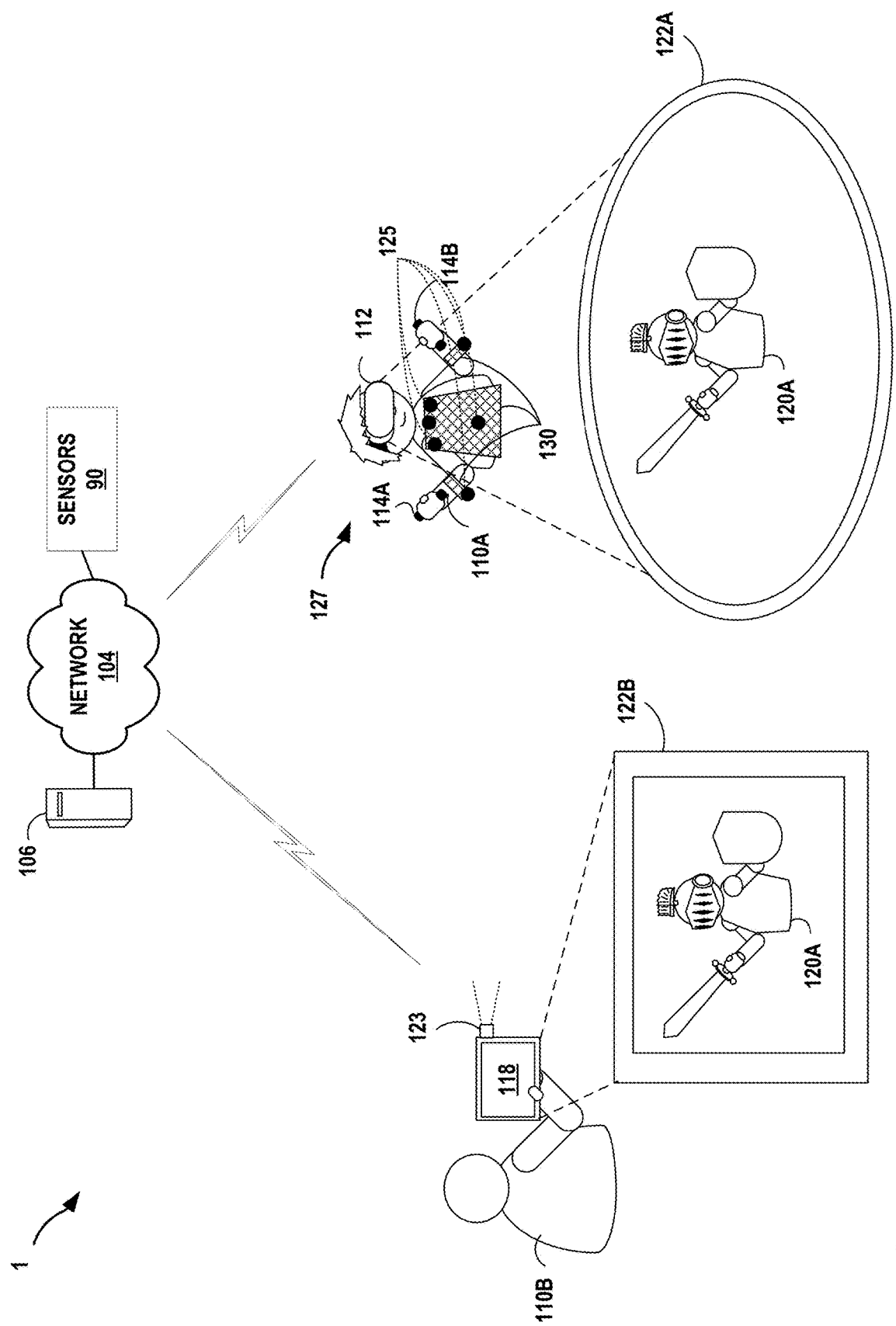
FIG. 1A is an illustration depicting an example artificial reality system that performs magnetic sensor-based body pose tracking of a user, in accordance with the techniques of the disclosure.

FIG. 1A is an illustration depicting example artificial reality system 1 that performs magnetic sensor-based body pose tracking of user 110A, in accordance with the techniques of the disclosure. As described in more detail below, magnetic sensor system 127 includes one or more wearable articles 130 configured to spatially arrange a plurality of magnetic sensor components 125 around a torso of a user 110A such that magnetic sensor data generated by magnetic sensor components 125 comprises tracking data for movements of the torso of user 110A. Artificial reality system 1 may calibrate magnetic sensor components 125 arranged within wearable articles 130 to improve accuracy of the body pose tracking.

In some use cases, image-based body pose computation has limitations that may impact accuracy. For example, image-based body pose computation may have decreased accuracy where parts of a body of a user are occluded with long hair, irregular-shaped clothes, other body parts, or other objects. Furthermore, image-based body pose computation may be computationally expensive where realistic lighting is simulated. Further, image-based body pose computation may exhibit reduced accuracy where lighting causes shadow artifacts. For inside-out data collection (e.g., where image-based body pose computation is performed using image data obtained from an image capture device of HMD 112), image-based body pose computation may be unable to image parts of a user's body due to a limited field of view. An IMU-based system may address the occlusion problem, but IMU position tracking may drift over time and change in different environments. For example, an IMU-based system may exhibit decreased accuracy detecting certain movements by user 110A, such as clapping or other two-handed gestures. Furthermore, an IMU-based system may have reduced tracking accuracy when a user moves between different spaces. Infrared sensor tracking may provide higher accuracy, but may not capture articles such as realistic clothes. Further, infrared sensor tracking may experience reduced accuracy due to interference in some environments (e.g., such as outdoors).

A magnetic sensor system, as described herein, may provide the advantages of image-based and IMU-based systems as well as overcoming the drawbacks of image-based and IMU-based systems for body motion ground truthing. For example, a magnetic sensor system as described herein provides occlusion-free sensor tracking and may provide higher accuracy of orientation and position tracking over image-based or IMU-based systems alone.

In the example of FIG. 1A, artificial reality system 1 includes head-mounted display (HMD) 112, controllers 114A-114B (collectively, "controllers 114") for HMD 112, console 106, user device 118, and, in some examples, one or more sensors 90. Furthermore, artificial reality system 1 includes wearable magnetic sensor system 127 that includes wearable article 130 configured to spatially arrange a plurality of multiple magnetic sensor components 125 on a body of user 110A.

As shown, HMD 112 is typically worn by user 110A and includes an electronic display and optical assembly for presenting artificial reality content 122A having images 120A to the user. In addition, HMD 112 includes one or more sensors (e.g., accelerometers) for tracking motion of HMD 112 and may include one or more image capture devices, e.g., cameras, line scanners and the like, for capturing image data of the surrounding environment. Each controller 114 is an input device which user 110A may use to provide input to console 106, HMD 112, or another component of artificial reality system 1.

In accordance with techniques of this disclosure, a wearable magnetic sensor system 127 includes wearable article 130 configured to spatially arrange a plurality of multiple magnetic sensor components 125 on a body of user 110A. Magnetic sensor components 125 are configured to generate and output respective magnetic sensor data indicative of respective locations of the magnetic sensor components 125, which artificial reality system 1 may use to compute a body pose of user 110A. A "body pose", as used herein, refers not only to a location and overall orientation of a user's body, but also refers to the configuration of the user's body, e.g., where their various body parts are located in relation to one another. Tracking and rendering, using an AR system for example, a body pose over time to create an avatar, allows the AR system to create animations of a user avatar by rendering the avatar in the configuration of the computed body pose at each time or frame.

In FIG. 1A, a wearable magnetic sensor system 127 includes one or more wearable articles 130 that spatially arrange magnetic sensor components 125 at different locations on a body of user 110A. Wearable magnetic sensor system 127 uses magnetic sensor components 125 to perform body pose tracking of user 110A. In some examples, each magnetic sensor component 125 includes a magnetic sensor configured to generate magnetic data indicative of a magnetic field sensed by the magnetic sensor of the respective magnetic sensor component 125. In some examples, wearable article 130 affixes at least one magnetic transmitter at a location on a torso of user 110A, the magnetic transmitter configured to generate the magnetic field sensed by each magnetic sensor of magnetic sensor components 125. In some examples, each magnetic sensor component 125 further includes an IMU configured to generate IMU data sensed at the respective magnetic sensor component 125.

In some examples, magnetic sensor components 125 are body-mounted to user 110A. For example, body-mounted magnetic sensor components 125 may be included in one or more wearable articles 130 (e.g., a vest, a shirt, a jacket, arm bands, and/or chest bands) positioned on a user's arms and torso. As depicted in the example of FIG. 1A, wearable articles 130 worn by user 110A include a vest and two arm bands, each of which includes at least one magnetic sensor component 125 of magnetic sensor components 125. Magnetic sensor system 127 may include wireless magnetic sensor components 125 along with a magnetic transmitter (not depicted in FIG. 1A) and a power supply (e.g., a battery) (not depicted in FIG. 1A), which may also be included on the wearable articles. The magnetic sensor components 125 are spatially arranged on the body of user 110A so as to maximize tracking accuracy and minimize interference between the magnetic sensor components 125, the magnetic transmitter (not depicted in FIG. 1A), and the power supply (not depicted in FIG. 1A). Each wearable article 130 may comprise a relatively rigid structure in order to stabilize magnetic sensor components 125 without inhibiting movement by user 110A. In addition, wearable article 130 (e.g., a vest, a shirt, a jacket, arm bands, wrist bands, and/or chest bands) may be constructed to hold various components of magnetic sensor system 127 (e.g., the magnetic transmitter or the magnetic sensor components 125) on the body of user 112 with appropriate weight distribution to maximize user comfort.

In general, artificial reality system 1 uses information obtained from a real-world or physical three-dimensional (3D) environment to render artificial reality content 122A-122B for display by HMD 112 and user device 118, respectively, to users 110A-110B (collectively, "users 11"). In the example of FIG. 1A, user 110A views the artificial reality content 122A constructed and rendered by an artificial reality application executing on console 106 and/or HMD 112, while user 110B views the artificial reality content 122B constructed and rendered by an artificial reality application executing on console 106 and/or user device 118. As one example, artificial reality content 122 may be a consumer gaming application in which user 110A is rendered as avatar 120A with, in some examples, as a mixture of real-world imagery and virtual objects, e.g., mixed reality and/or augmented reality. In other examples, artificial reality content 122A-122B may correspond to, e.g., a video conferencing application, a navigation application, an educational application, training or simulation applications, augmented reality application, virtual reality application, or other type of applications that implement artificial reality. As used in this disclosure, the phrase "A and/or B" may refer to A only, B only, or both A and B.

User device 118 may represent a laptop computer, mobile phone, personal digital assistant, tablet computer, HMD, smart goggles/glasses, or other user device having a display by which user device 118 displays artificial reality content 122B to user 110B. User device 118 may have more limited input/output, tracking, or user interface device capabilities than HMD 112. For example, user device 118 may not enable tracking by sensors 90, may be unable to display artificial reality content 122B using a 3D display device, may have a more limited image capture device 123 or no image capture device 123, or may have no accelerometers, global positioning system (GPS) sensors, or other devices by which the user device 118 may track a location or local pose within the physical 3D environment. User device 118 may not enable user inputs that result in event data for an artificial reality application executed by artificial reality system 1. User device 118 may not contribute tracking information, mapping information for the physical 3D environment, and/or event data for the artificial reality application. In some examples, user device 118 has similar input/output, tracking, or user interface capabilities as HMD 112 but is not configured to use the capabilities in conjunction with other components of artificial reality system 1. In the example of FIG. 1A, user device 118 has an image capture device 123, such as a camera, which generates images of the physical 3D environment.

Both user device 118 and HMD 112 are user devices in that the devices are computing devices used by a user to interact with other components of artificial reality system 1. Artificial reality system 1 may, in other examples, include a set of one or more instances of HMDs 112 all operating concurrently within the physical 3D environment along with a set of one or more instances of user devices 118 also operating concurrently within the physical 3D environment.

In the example of FIG. 1A, console 106 is shown as a single computing device, such as a gaming console, workstation, a desktop computer, or a laptop. In other examples, console 106 may be distributed across a plurality of computing devices, such as a distributed computing network, a data center, or a cloud computing system. Console 106, HMD 112, controllers 114, user device 118, and sensors 90 may, as shown in this example, be communicatively coupled via network 104, which may be a wired or wireless network, such as Wi-Fi, a mesh network or a short-range wireless communication medium. Controllers 114 may be in communication with HMD 112 using near-field communication or short-range wireless communication such as Bluetooth, using wired communication links, or using another type of communication links. Although HMD 112 is shown in this example as in communication with, e.g., tethered to or in wireless communication with, console 106, in some implementations HMD 112 operates as a stand-alone, mobile artificial reality system. As such, some or all functionality attributed to console 106 in this disclosure may be distributed among one or more user devices, such as one or more instances of HMD 112 and user device 118.

In some examples, artificial reality system 1 may enable multiple different modes of engagement for user devices to facilitate different types of interaction by the user devices within artificial reality system 1. Each mode of engagement may be configured within the artificial reality system 1 and may specify one or more permissible types of interaction by a user device with the artificial reality system 1. A mode of engagement for a user device may be based in part on a role of user 110 associated with the user device, characteristics of the user device including interface devices thereof, a configuration of the user device for an artificial reality application, a location of the user device within a physical 3D environment, a version of the artificial reality application executed by the user device, and/or the time and date in which the user device is operating, for example.

In the example of FIG. 1A, user 110A may be a "player" or "participant" in the artificial reality application and HMD 112 associated with the player user 110A therefore operates according to a first mode of engagement, which permits one or more types of interactions by the HMD 112 within the artificial reality system 1. For example, HMD 112 operating according to the first mode of engagement may receive artificial reality content for display and contribute event data that affects a state of the artificial reality application. As another example, HMD 112 operating according to the first mode of engagement may send indications of user inputs received by controllers 114 to console 106 to cause the console 106 to alter a state of objects within the artificial reality application, e.g., moving an avatar, moving a virtual object, engaging a virtual object such as using a tool or virtual device within the artificial reality, and so forth. As another example, artificial reality system 1 may track HMD 112 operating according to the first mode of engagement using tracking information from magnetic sensor system 127, sensors 90, and/or HMD 112 to determine poses of both user 110A and/or the HMD 112 within the physical 3D environment. As another example, HMD 112 operating according to the first mode of engagement may generate and upload mapping information to console 106, where console 106 can use the mapping information to generate a master 3D map of the physical 3D environment. In general, a map of any area within the physical 3D environment specifies locations of objects, e.g., using map points identified in images that denote the geometry of a scene and can be used to generate a topography of the area. Mapping information may include images or video captured by a camera and tracking information, such as user device coordinates or motion vectors, for instance. Mapping information may include 3D point clouds; polygon, triangle, or other type of mesh models; elevation models; topographic maps; volumetric distance fields; surface models such as non-uniform rational basis spline surface models; depth maps; and so forth. Tracking information may also include magnetic sensor data from magnetic sensor system 127, internal user device sensor data, external sensor data from sensors 90, IMU data, images from external cameras, sensor data from other tracking devices, or other information useful for computing a local pose for a user device.

Further in the example of FIG. 1A, user 110B may be a "spectator" or an "observer" in the artificial reality application and user device 118 associated with the spectator user 110B therefore operates according to a second mode of engagement, which permits one or more types of interactions by the user device 118 within the artificial reality system 1, which may be more limited than the types of interactions permitted by the first mode of engagement for HMD 112 associated with the player user 110A. For example, user device 118 operating according to the second mode of engagement may receive artificial reality content for display but may not contribute event data that affects a state of the artificial reality application. As another example, user device 118 may contribute mapping information but not receive artificial reality content for display. User device 118 may be unable to contribute tracking information and/or artificial reality system 1 may not generate tracking information for user device 118.

The mode of engagement for a user device may also determine the method by which the artificial reality system 1 computes a local pose for the user device. For instance, artificial reality system 1 may compute a local pose for HMD 112 using magnetic sensor data from magnetic sensor system 127 and tracking information for the HMD 112, but user device 118 may compute a local pose for the user device 118 using an image captured at the local pose by image capture device 123 and compared to a topography map for the physical 3D environment that has been downloaded to user device 118. In this way, user device 118, which operates according to a second mode of engagement more limited than the first mode of engagement for HMD 112, may still be localized within the physical 3D environment by computing the local pose. Furthermore, artificial reality system 1 may generate artificial reality content 122A not only for the HMD 112 but also generate artificial reality content 122B for the user device 118 according to the local pose computed for user device 118 and corresponding to a map of the physical 3D environment. In this example, the artificial reality content 122B is the avatar 120A of user 110A, where the avatar 120A may be in the artificial 3D environment mapped to user 110A located in the physical 3D environment, and where the avatar 120A is presented for display to user 110B in the artificial 3D environment based on a current view perspective of a frame of reference, i.e., at the computed local pose for user device 118.

Users 110A-110B may be concurrently using the artificial reality system 1 such that HMD 112 and user device 118 concurrently operate according to their respective modes of engagement within the artificial reality system 1. As a result, the artificial reality system 1 may include computing infrastructure that enables asymmetric user experiences to users 110 associated with user devices that operate according to different modes of engagement with the artificial reality system. At least in some cases, moreover, artificial reality system 1 generates artificial reality content by computing local poses for user devices differently according to the modes of engagement for the user devices, where such modes may vary based on the capabilities of the user devices. Artificial reality system 1 may in this way be engaged by a more limited class of user devices, e.g., non-HMDs such as mobile phones or tablet computers, according to modes of engagement that still provides users of such user devices, such as user 110B, with access to the artificial reality content and/or allows such user devices to contribute mapping information to the artificial reality system, while preventing more limited classes of user devices from interacting with artificial reality system 1 in other ways.

FIG. 1B is an illustration depicting another example artificial reality system 2 that provides asymmetric user experiences to users 110A-110C associated with respective user devices that operate according to different modes of engagement with the artificial reality system 2, in accordance with the techniques of the disclosure. In this example, artificial reality system 2 includes cameras 102A and 102B (collectively, "cameras 102"), magnetic sensor systems 127A and 127B (collectively, "magnetic sensor systems 127"), HMDs 112A and 112C (collectively, "HMDs 112"), console 106, sensors 90, and user device 118. HMDs 112A and 112C may operate in a substantially similar fashion as HMD 112 of FIG. 1. Magnetic sensor systems 127A and 127B may operate in a substantially similar fashion as magnetic sensor system 127 of FIG. 1.

As shown in FIG. 1B, artificial reality system 2 provides a multi-user artificial reality application executing on console 106, HMDs 112 and/or user device 118 to present artificial reality content to each user based on a current viewing perspective of a corresponding frame of reference for that user. That is, in this example, the artificial reality application constructs artificial content by tracking and computing pose information for a frame of reference for each of HMDs 112 and user device 118. Artificial reality system 2 uses data received from magnetic sensor systems 127, cameras 102, HMDs 112, controllers 114, and user device 118 to capture 3D information within the real-word, physical 3D environment, such as motion by users 110 and/or tracking information with respect to users 110 and objects 108, for use in computing updated pose information for a corresponding frame of reference of HMDs 112 or user device 118. As one example, the artificial reality application may render, based on a current viewing perspective determined for user device 118, artificial reality content 122 having content objects 128A-128C as spatially overlaid upon real world objects 108A-108C (collectively, "objects 108"). Further, from the perspective of user device 118, artificial reality system 2 renders avatars 120A, 120B based upon the estimated positions and poses for users 110A, 110C, respectively. In FIG. 1B, both user 110A and user 110C are wearing examples of magnetic sensor system 127 of FIG. 1A, in accordance with techniques of this disclosure.

Figure 2A:
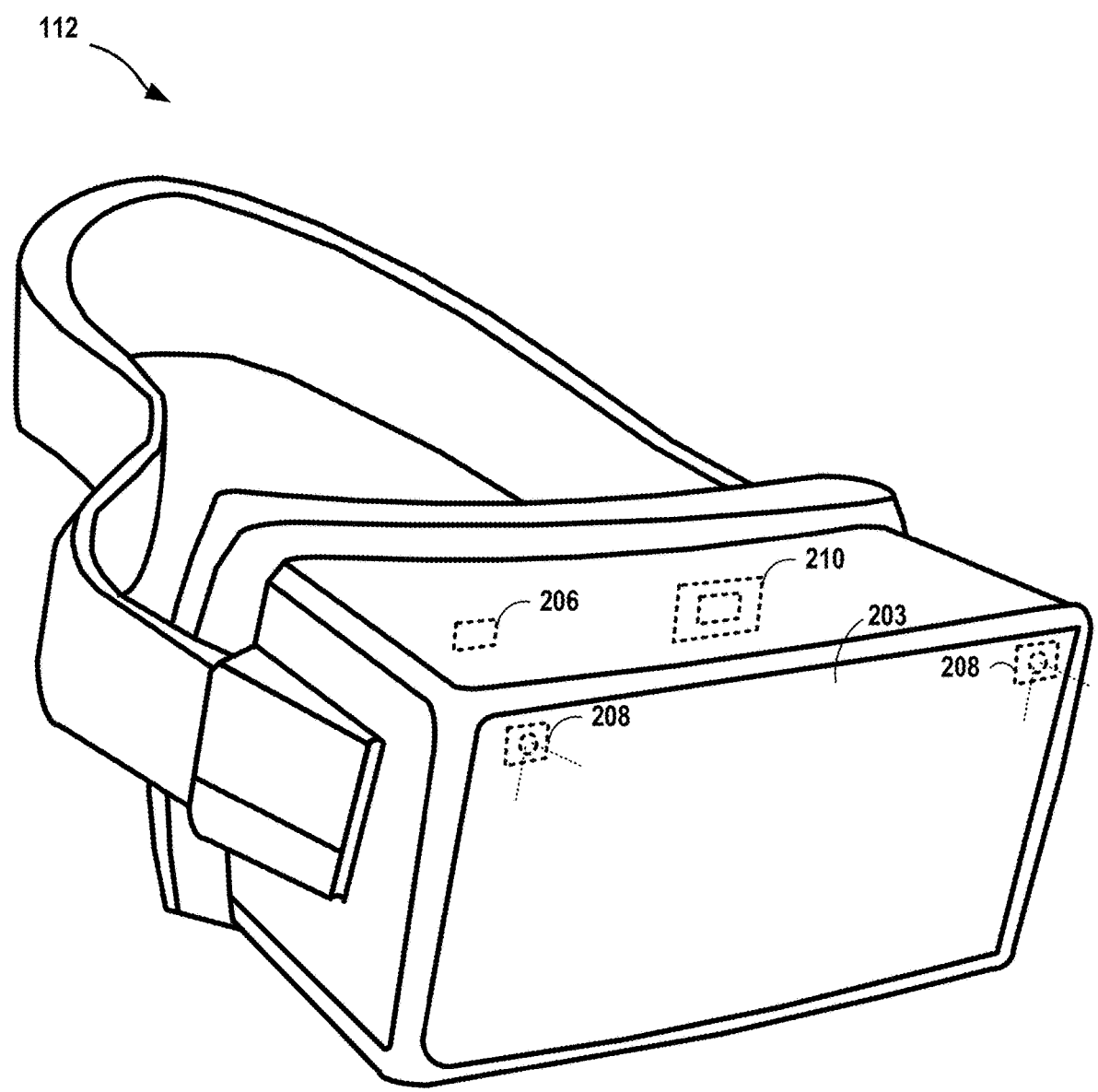
FIG. 2A is an illustration depicting an example HMD configured to operate in accordance with the techniques of the disclosure.

FIG. 2A is an illustration depicting an example HMD 112 configured to operate in accordance with the techniques of the disclosure. HMD 112 of FIG. 2A may be an example of any of HMDs 112 of FIGS. 1A and 1B. HMD 112 may be part of an artificial reality system, such as artificial reality systems 1, 2 of FIGS. 1A, 1B, or may operate as a stand-alone, mobile artificial realty system configured to implement the techniques described herein. HMD 112 may include a mobile device (e.g., a smart phone) that is removable from the body of the HMD 112.

In this example, HMD 112 includes a front rigid body and a band to secure HMD 112 to a user. In addition, HMD 112 includes an interior-facing electronic display 203 configured to present artificial reality content to the user. Electronic display 203 may be any suitable display technology, such as liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating visual output. In some examples, the electronic display is a stereoscopic display for providing separate images to each eye of the user. In some examples, the known orientation and position of display 203 relative to the front rigid body of HMD 112 is used as a frame of reference, also referred to as a local origin, when tracking the position and orientation of HMD 112 for rendering artificial reality content according to a current viewing perspective of HMD 112 and the user.

As further shown in FIG. 2, in this example HMD 112 further includes one or more sensors 206, such as one or more accelerometers (also referred to as inertial measurement units or "IMUs") that output data indicative of current acceleration of HMD 112, GPS sensors that output data indicative of a location of HMD 112, radar or sonar sensors that output data indicative of distances of the HMD 112 from various objects, or other sensors that provide indications of a location or orientation of HMD 112 or other objects within a physical 3D environment. Moreover, HMD 112 may include one or more integrated image capture devices 208, such as a video camera, laser scanner, Doppler radar scanner, depth scanner, or the like, configured to output image data representative of a surrounding real-world environment. HMD 112 includes an internal control unit 210, which may include an internal power source and one or more printed-circuit boards having one or more processors, memory, and hardware to provide an operating environment for executing programmable operations to process sensed data and present artificial-reality content on display 203. Internal control unit 210 may be part of a removable computing device, such as a smart phone.

The HMD 112 may compute, based in part on sensed data generated by motion sensors 206 and/or images generated by image capture devices 208, a current pose for a frame of reference of HMD 112. Control unit 201 may include a pose tracking unit, which can execute software for processing the sensed data and/or images to compute the current pose. Control unit 201 may store a master 3D map for a physical environment and compare processed images to the master 3D map to compute the current pose. Alternatively, or additionally, control unit 201 may compute the current pose based on sensor data generated by sensors 206. Based on the computed current pose, control unit 201 may render artificial reality content corresponding to the master 3D map for an artificial reality application, and control unit 201 may display the artificial reality content via the electronic display 203.

In some examples, control unit 201 may peer with one or more controllers for HMD 112 (controllers not shown in FIG. 2). Control unit 201 may receive sensor data from the controllers that provides indications of user inputs or controller orientations or locations within the physical 3D environment or relative to HMD 112. Control unit 201 may send representations of the sensor data to a console for processing by the artificial reality application, where the indications may be event data for an artificial reality application. Control unit 201 may execute the artificial reality application to process the sensor data.

Figure 2B:
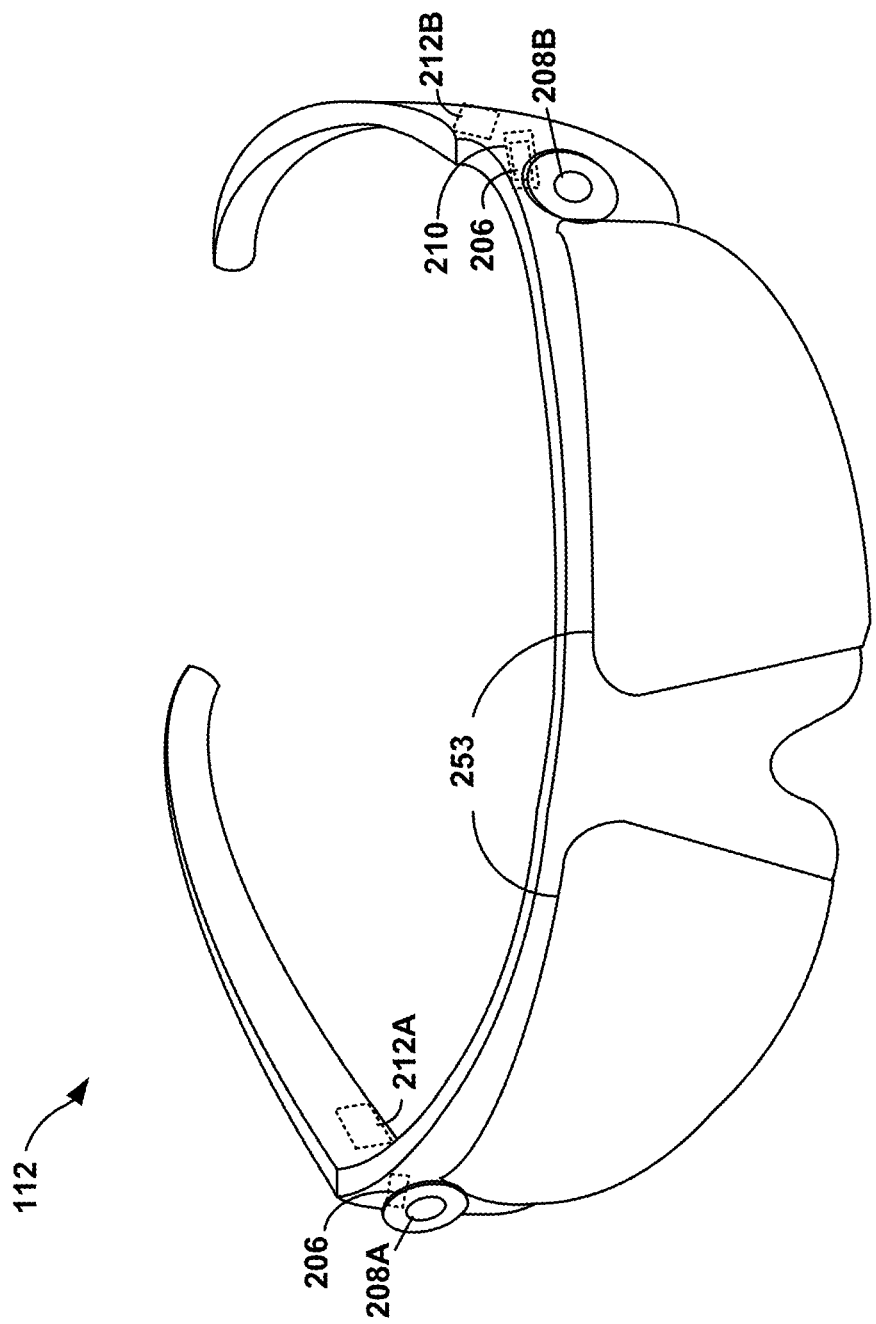
FIG. 2B is an illustration depicting another example HMD configured to operate in accordance with the techniques of the disclosure.

FIG. 2B is an illustration depicting another example HMD configured to operate in accordance with the techniques of the disclosure. HMD 112 of FIG. 2B may be an example of any of HMDs 112 of FIGS. 1A and 1B. HMD 112 may be part of an artificial reality system, such as artificial reality systems 1, 2 of FIGS. 1A, 1B, or may operate as a stand-alone, mobile artificial realty system configured to implement the techniques described herein. HMD 112 of FIG. 2B may operate in a substantially similar fashion as HMD 112 of FIG. 2A.

In the example of FIG. 2B, HMD 112 comprises an eyeglass form factor that includes a rigid frame front having two eyepieces connected by a nose bridge and two temples or arms that fit over a user's ears to secure HMD 112 to the user. In addition, in place of lenses in a traditional pair of eyeglasses, HMD 112 includes interior-facing electronic display 253 configured to present artificial reality content to the user. Electronic display 253 may be any suitable display technology, such as liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating visual output. In some examples, electronic display 253 is a stereoscopic display for providing separate images to each eye of the user. In some examples, the known orientation and position of display 253 relative to the rigid frame front of HMD 112 is used as a frame of reference, also referred to as a local origin, when tracking the position and orientation of HMD 112 for rendering artificial reality content according to a current viewing perspective of HMD 112 and the user.

As further shown in FIG. 2, in this example HMD 112 further includes one or more motion sensors 206, such as one or more accelerometers (also referred to as inertial measurement units or "IMUs") that output data indicative of current acceleration of HMD 112, GPS sensors that output data indicative of a location of HMD 112, radar, or sonar that output data indicative of distances of HMD 112 from various objects, or other sensors that provide indications of a location or orientation of HMD 112 or other objects within a physical environment. Moreover, HMD 112 may include one or more integrated image capture devices 208A and 208B (collectively, "image capture devices 208"), such as video cameras, laser scanners, Doppler® radar scanners, depth scanners, or the like, configured to capture image data representative of the physical environment. HMD 112 may also include one or more integrated audio capture devices 212A and 212B (collectively "audio capture devices 212"), such dynamic microphones, condenser microphones, piezoelectric microphones, or the like coupled to digital audio recording devices, configured to capture audio data of the user and the physical environment.

HMD 112 includes an internal control unit 210, which may include an internal power source and one or more printed-circuit boards having one or more processors, memory, and hardware to provide an operating environment for executing programmable operations to process sensed data and present artificial-reality content on display 253.

Figure 3:
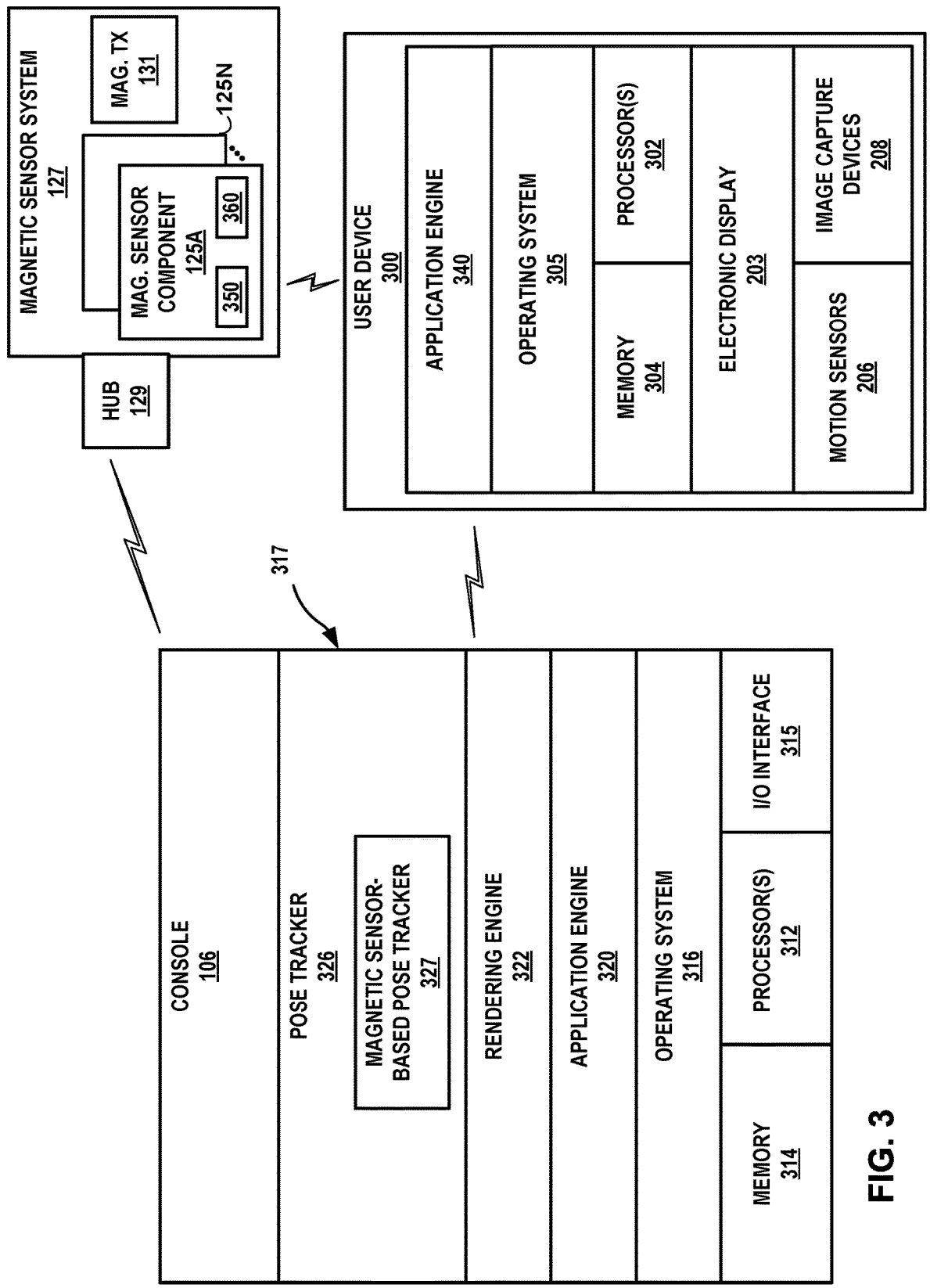
FIG. 3 is a block diagram showing example implementations of a console, a magnetic sensor system, and a user device, such as any of the HMDs or a user device of FIG. 1A-1B, or 2A-2B.

FIG. 3 is a block diagram showing example implementations of console 106, magnetic sensor system 127, and a user device, such as any of HMDs 112 or user device 118 of FIG. 1A-1B, or 2A-2B.

In this example, user device 300 includes one or more processors 302 and memory 304 that, in some examples, provide a computer platform for executing an operation system 305, which may be an embedded, real-time multitasking operating system. In turn, operating system 305 provides a multitasking operating environment for executing one or more software components 317. Processors 302 are coupled to electronic display 306. In this example, user device 300 includes motion sensors 206 and image capture devices 208 coupled to processor 302, but other examples of user devices 300 may include neither or merely one of motion sensors 206 or image capture devices 208. In some examples, processors 302 and memory 304 may be separate, discrete components. In other examples, memory 304 may be on-chip memory collocated with processors 302 within a single integrated circuit. The memory 304, processors 302, operating system 305, and application engine 340 components may collectively represent an example of internal control unit 201 of FIG. 2.

User device 300 may include user input devices, such as a touchscreen or other presence-sensitive screen example of electronic display 203, microphone, controllers, buttons, keyboard, and so forth. Application engine 340 may generate and present a login interface via electronic display 203. A user of user device 300 may use the user interface devices to input, using the login interface, login information for the user. User device 300 may send the login information to console 106 to log the user into the artificial reality system.

Operating system 305 provides an operating environment for executing one or more software components, which include application engine 320. Application engine 320 may be an artificial reality application having one or more processes. Application engine 320 may execute according to a mode of engagement 304 configured for user device 300 for the artificial reality application. The mode of engagement 304 may specify one or more permissible types of interaction for user device 300 within the artificial reality system in which user device 300 is participating. Application engine 320 may send, to console 106 as mapping information using an I/O interface (not shown in FIG. 3) via a network or other communication link, representations of sensor data generated by motion sensors 206 or images generated by image capture devices 208. The artificial reality application may be, e.g., a teleconference application, a gaming application, a navigation application, an educational application, or training or simulation application, for example.

In general, console 106 is a computing system that interfaces with user devices of an artificial reality system. In some examples, console 106 interfaces with the user devices according to respective modes of engagement 334 for the user devices. Modes of engagement 334 stores one or more modes of engagement for one or more user devices interacting with console 106 or otherwise participating an artificial reality system that includes console 106. In some examples, console 106 generates, based at least on mapping information received from user devices, a master 3D map of a physical 3D environment in which the user devices are located.

In some examples, console 106 is a single computing device, such as a workstation, a desktop computer, a laptop. In some examples, at least a portion of console 106, such as processors 352 and/or memory 354, may be distributed across one or more computing devices, a cloud computing system, a data center, or across a network, such as the Internet, another public or private communications network, for instance, broadband, cellular, Wi-Fi, and/or other types of communication networks, for transmitting data between computing systems, servers, and computing devices.

In the example of FIG. 3, console 106 includes one or more processors 312 and memory 314 that provide a computer platform for executing an operating system 316. In turn, operating system 316 provides an operating environment for executing one or more software components 317. Processors 312 are coupled to I/O interface 315, which provides one or more I/O interfaces for communicating with external devices, such as a keyboard, game controllers, display devices, image capture devices, and the like. Moreover, I/O interface 315 may include one or more wired or wireless network interface cards (NICs) for communicating with a network, such as network 104. Each of processors 302, 312 may comprise any one or more of a multi-core processor, a controller, a digital signal processor (DSP), an application specific integrated circuit (ASIC), a field-programmable gate array (FPGA), or equivalent discrete or integrated logic circuitry. Memory 304, 314 may comprise any form of memory for storing data and executable software instructions, such as random-access memory (RAM), read-only memory (ROM), programmable read-only memory (PROM), erasable programmable read-only memory (EPROM), electronically erasable programmable read-only memory (EEPROM), and/or Flash memory.

Software components 317 of console 106 operate to provide an overall artificial reality application. In this example, software components 317 include application engine 320, rendering engine 322, and pose tracker 326.

In general, application engine 314 includes functionality to provide and present an artificial reality application, e.g., a teleconference application, a gaming application, a navigation application, an educational application, training or simulation applications, and the like. Application engine 314 and application engine 340 may cooperatively provide and present the artificial reality application in some examples. Application engine 314 may include, for example, one or more software packages, software libraries, hardware drivers, and/or Application Program Interfaces (APIs) for implementing an artificial reality application on console 106. Responsive to control by application engine 320, rendering engine 322 generates 3D artificial reality content for display to the user by application engine 340 of user device 300.

Application engine 320 and rendering engine 322 construct the artificial reality content for display to user 110 in accordance with current pose information for a frame of reference, typically a viewing perspective of HMD 112, as determined by pose tracker 326. Based on the current viewing perspective, rendering engine 322 constructs the 3D, artificial reality content which may be overlaid, at least in part, upon the physical 3D environment in which user device 300 is located. During this process, pose tracker 326 may operate on sensed data received from user device 300, such as movement information and user commands, and, in some examples, data from any external sensors 90 or external camera 102 (as shown in FIGS. 1A, 1B) to capture 3D information within the physical 3D environment, such as motion by user device 300, a user thereof, a controller, and/or feature tracking information with respect to the user thereof. Based on the sensed data, pose tracker 326 determines a current pose for the frame of reference of user device 300 and, in accordance with the current pose, generates the artificial reality content for communication to user device 300 for display to the user via electronic display 203.

In accordance with techniques described herein, magnetic sensor system 127 includes a plurality of multiple magnetic sensor components 125A-125N (hereinafter, "magnetic sensor components 125") that each generates sensor data and wirelessly sends the sensor data to data hub 129. In some examples, each magnetic sensor component 125 includes magnetic sensor 350 and supporting circuitry that generates magnetic sensor data from a sensed magnetic field generated by magnetic transmitter 131. Each magnetic sensor 350 may be a 3-axis magnetic sensor. As used herein, the term "magnetic sensor" may refer to either magnetic sensor 350 or magnetic sensor component 125 that includes magnetic sensor 350. In some examples, each magnetic sensor component 125 includes IMU 360 (e.g., accelerometer and/or gyroscope) that generates IMU data for the magnetic sensor component 125. Each magnetic sensor component 125 transmits the magnetic sensor data and IMU data to data hub 129.

Data hub 129 may be the user device 300 (e.g., an HMD), a computing device, a smart phone or other personal computing device, a stage device, or other device capable of wirelessly receiving data from magnetic sensor components 125 and wireless transmitting the collected data to another device. Magnetic transmitter 131 creates the magnetic field sensed by each magnetic sensor 350 of each magnetic sensor component 125 to generate sensor data indicative of a location of the magnetic sensor component 125 in relation to the magnetic transmitter 131.

Data hub 129 wirelessly sends the collected sensor data (or a representation thereof) to console 106, either directly or via user device 300. Magnetic sensor components 125 may each be coupled to electronic circuitry that manages timing of sensor data sampling, as well as sensor data generation and transmission to data hub 129.

Pose tracker 326 includes a magnetic sensor-based pose tracker 327 that computes body poses for the user based at least on the sensor data generated by magnetic sensor components 125. Pose tracker 326 may incorporate, into the pose tracking computation algorithm, the body poses computed by magnetic sensor-based pose tracker 327 to improve an overall rendering of a user avatar in the artificial reality content being rendered by rendering engine 322.

Magnetic sensor-based pose tracker 327 may perform calibration of magnetic sensor components 125 of magnetic sensor system 127 to improve an accuracy of body pose tracking. While in the example of FIG. 3, magnetic sensor-based pose tracker 327 performs such calibration, in other examples, another component of console 106, user device 300, or magnetic sensor system 127 performs such calibration. For example, console 106 may include a calibration engine configured to calibrate magnetic sensor components 125 of magnetic sensor system 127.

The calibration techniques include intrinsic calibration of magnetic data and inertial measurement unit (IMU) data for each magnetic sensor component 125 using distortion and noise modeling that varies according to sensor location on the user's body. The calibration techniques also include fusion of the multi-sensor data, i.e., magnetic and IMU data, to provide high accuracy results and noise tolerance. In addition, the calibration techniques include sensor-to-camera system calibration to integrate the magnetic sensors into the HMD camera field of view (FoV) and optic ground truth system calibration. In some examples, optional sensor-to-skeleton calibration may be performed to enhance body pose tracking accuracy. More specifically, instead of assuming that the magnetic sensors are positioned at a user's joints, e.g., wrists, elbows, shoulders, and hips, the sensor-to-skeleton calibration techniques determine the exact location of each of the magnetic sensors with respect to the skeleton or joints of an individual user's body. Once the magnetic sensors are calibrated, the magnetic sensors may be used for body pose tracking in several different AR system use cases. In one use case, the calibrated magnetic sensors may be used in conjunction with or as an alternative to image tracking performed by the HMD in order to continue tracking the user's body even if a portion of the user's body is occluded from the HMD cameras. In another use case, in a mobile setting, the calibrated magnetic sensors may be used alone to infer body pose based on magnetic sensor positions and offsets from predefined body joints. In a further use case, the calibrated magnetic sensors may be used to gather body pose tracking information to build ground truth data for a user agnostic machine learning (ML) model.

The calibration algorithm applied may include pre-processing (before the skeleton model). The calibration algorithm may include a raw data pre-processing operation. The raw data pre-processing algorithm includes intrinsic calibration of magnetic sensors 350 of magnetic sensor components 125A as well as fusion of data from sensors of multiple types so as to improve the accuracy of tracking. The intrinsic calibration may include intrinsic calibration of magnetic sensors 350 with respect to a model of magnetic distortion and noise over the human body. Further, the intrinsic calibration may include intrinsic calibration of IMUs 360 with respect to a model of IMU distortion and noise over the human body. The pre-processing algorithm may fuse data from sensors of multiple types, such as magnetic sensor data of magnetic sensors 350 and IMU data from IMUs 360, to provide high accuracy results and tolerance to many different kinds of noise and failure cases.

The calibration algorithm may further include a sensor-to-camera calibration operation, where magnetic sensors 350 are calibrated with image data from an image capture device of, e.g., HMD 112. The sensor-to-camera calibration operation may include modeling of geometry error, environmental interference, time error, and geometry mapping to a domain of the image capture device. During the sensor-to-camera calibration operation, multiple types of sensors are calibrated asynchronously. Further, magnetic sensors 350 are calibrated with one or more image capture devices of HMD 112. Magnetic sensors 350 are further calibrated with an optic track (e.g., an optic ground truthing system).

The calibration algorithm may further include calibration of magnetic sensors 130 to a skeletal model to teach camera supervision. In some examples, this calibration operation applies a machine learning model to calibrate magnetic sensors 130 to the skeletal model. For example, magnetic sensor-based pose tracker 327 calibrates an offset (e.g., at least one of a rotation or a translation) of each of magnetic sensors 130 with regard to positions of predefined body joints on the skeletal model. In such a calibration operation, a user wears magnetic sensor components 125 at predefined body positions, such as near wrists, elbows, shoulders, etc. A meta-system that includes both a computer vision-based body capture system and magnetic sensor system 127 captures body data from the user and calibrates the components of the computer vision-based body capture system and magnetic sensor system 127 in the same coordinate space. Magnetic sensor-based pose tracker 327 computes body pose data on a predefined skeletal model from the body data of multiple modalities and different types of sensors. Magnetic sensor-based pose tracker 327 computes the offsets (translation and rotation) of magnetic sensors 350 against the body joints and considers the offsets of magnetic sensors 350 as fixed with respect to the body joints during subsequent data recording.

Once the sensor intrinsic calibration, sensor-camera calibration, and sensor-skeleton calibration are computed, the magnetic sensor system with the magnetic sensor-based pose tracker(s) can be used in multiple ways to generate body tracking data. For example, they can be used in combination with other body capture systems to help refine the body tracking results to be more accurate. They can also be used in a mobile setting, where the magnetic sensor-based pose tracker(s) infer body pose from the magnetic sensor positions and their relative offsets from predefined body joints.

Magnetic sensor-based pose tracker 327 uses magnetic sensor data obtained from each one of magnetic sensor components 125 to compute a location of each magnetic sensor component 125 on the body of the user. For example, magnetic sensor-based pose tracker 327 maintains a predefined skeletal model that maps respective locations of each magnetic sensor component 125 to the body of the user. Magnetic sensor-based pose tracker 327 uses the magnetic sensor data obtained from each one of magnetic sensor components 125 to determine a position of magnetic sensor components 125 with respect to one or more body parts or joints of the predefined skeletal model. For example, magnetic sensor-based pose tracker 327 uses the magnetic sensor data to compute at least one of a translation or a rotation of each magnetic sensor component 125 with respect to a body joint of the predefined skeletal model. Magnetic sensor-based pose tracker 327 uses the computed location of magnetic sensor components 125 on the body of the user to compute the body pose of the user. For example, by assuming that each magnetic sensor component 125 is positioned at a corresponding joint or body part of the user, magnetic sensor-based pose tracker 327 may use magnetic sensor data to identify a change in position of a magnetic sensor unit 125 and equate the change in position of the body part at which the magnetic sensor unit 125 is positioned.

In some examples, pose tracker 326 computes a body pose of the user by fusing the magnetic sensor data obtained from each magnetic sensor of magnetic sensor components 125 with at least one of IMU data obtained from an IMU of respective magnetic sensor components 125 or with image data obtained from an image capture device integrated within HMD 112 or user device 118. For example, the IMU data may include orientation, acceleration, and latitude data that allows pose tracker 326 to increase the accuracy in the determined locations of magnetic sensor components 125, thereby enhancing the accuracy in pose tracking. Further, pose tracker 326 may use the image data to provide a "ground truth" to validate or verify the determined locations of magnetic sensor components 125. For example, pose tracker 326 may identify a location of a body part of the user depicted in the image data, and use the identified location of the body part to verify a location determined for a corresponding magnetic sensor 125 positioned at the body part. By fusing the magnetic sensor data with the IMU data and/or the image data, pose tracker 326 may perform pose tracking of the user that is robust to many forms of noise and exhibits a high degree of accuracy. In some examples, some or all of the functionality attributed to pose tracker 326, rendering engine 322, and application engine 320 may be performed by user device 300.

Figure 4:
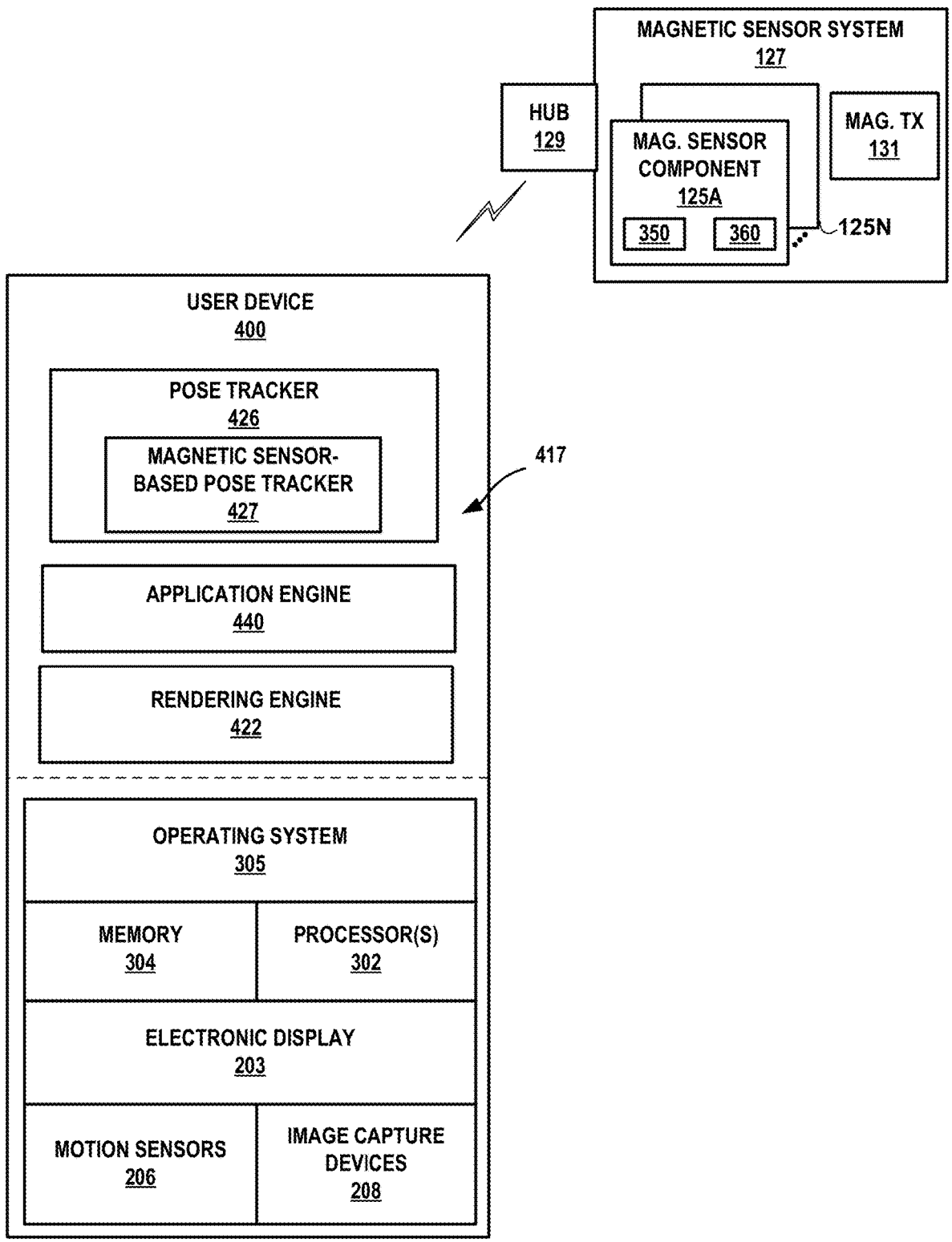
FIG. 4 is a block diagram depicting an example of a magnetic sensor system and a user device for an artificial reality system, in accordance with techniques of this disclosure.

FIG. 4 is a block diagram depicting an example of a user device for an artificial reality system, in accordance with techniques of this disclosure. User device 400 operates as a stand-alone device, i.e., is not tethered to a console, and may represent an instance of any of the aforementioned user devices. User device 400 may represent an HMD or tablet computer, for instance. In this example, similar to FIG. 3, user device 400 includes one or more processors 302 and memory 304 that, in some examples, provide a computer platform for executing an operation system 305, which may be an embedded, real-time multitasking operating system. In turn, operating system 305 provides an operating environment for executing one or more software components 417. Moreover, processor(s) 302 are coupled to electronic display 203, motion sensors 206, and image capture devices 208.

In the example of FIG. 4, software components 417 operate to provide an overall artificial reality application. In this example, software components 417 include application engine 440, rendering engine 422, pose tracker 426. In various examples, software components 417 operate similar to the counterpart components of console 106 of FIG. 3 (e.g., application engine 320, rendering engine 322, pose tracker 326).

The software components 417 may operate according to mode of engagement 303 for user device 400. User device 400 may localize the user device 400 using a method specified by the mode of engagement 303. User device 400 may generate map data 430, in some cases only if this type of interaction within the artificial reality system is specified by mode of engagement 303. User device 400 may send the map data 430 to other user devices and receive map data from other user devices to cooperatively generate a master 3D map for the physical 3D environment, in some cases only if this type of interaction within the artificial reality system is specified by mode of engagement 303. User device 400 may generate artificial reality content for display by electronic display 203, in some cases only if this type of interaction within the artificial reality system is specified by mode of engagement 303. User device 400 may send event data to a console or other user device within the artificial reality system, in some cases only if this type of interaction within the artificial reality system is specified by mode of engagement 303. Event data may include indications of user input, indications of a status or local pose of the user device 400, indications of operations or activities by the user device 400, or other event data that may affect a state of the artificial reality application, whether distributed among multiple user devices or centralized in user device 400.

User device 400 includes a pose tracker 426 that includes a magnetic sensor-based pose tracker 427, which performs operations similar to those described with respect to magnetic sensor-based pose tracker 327 of FIG. 3. Pose tracker 426 may incorporate, into the pose tracking computation algorithm, the body poses computed by magnetic sensor-based pose tracker 427 to improve an overall rendering of a user avatar in the artificial reality content being rendered by rendering engine 422.

Figure 5:
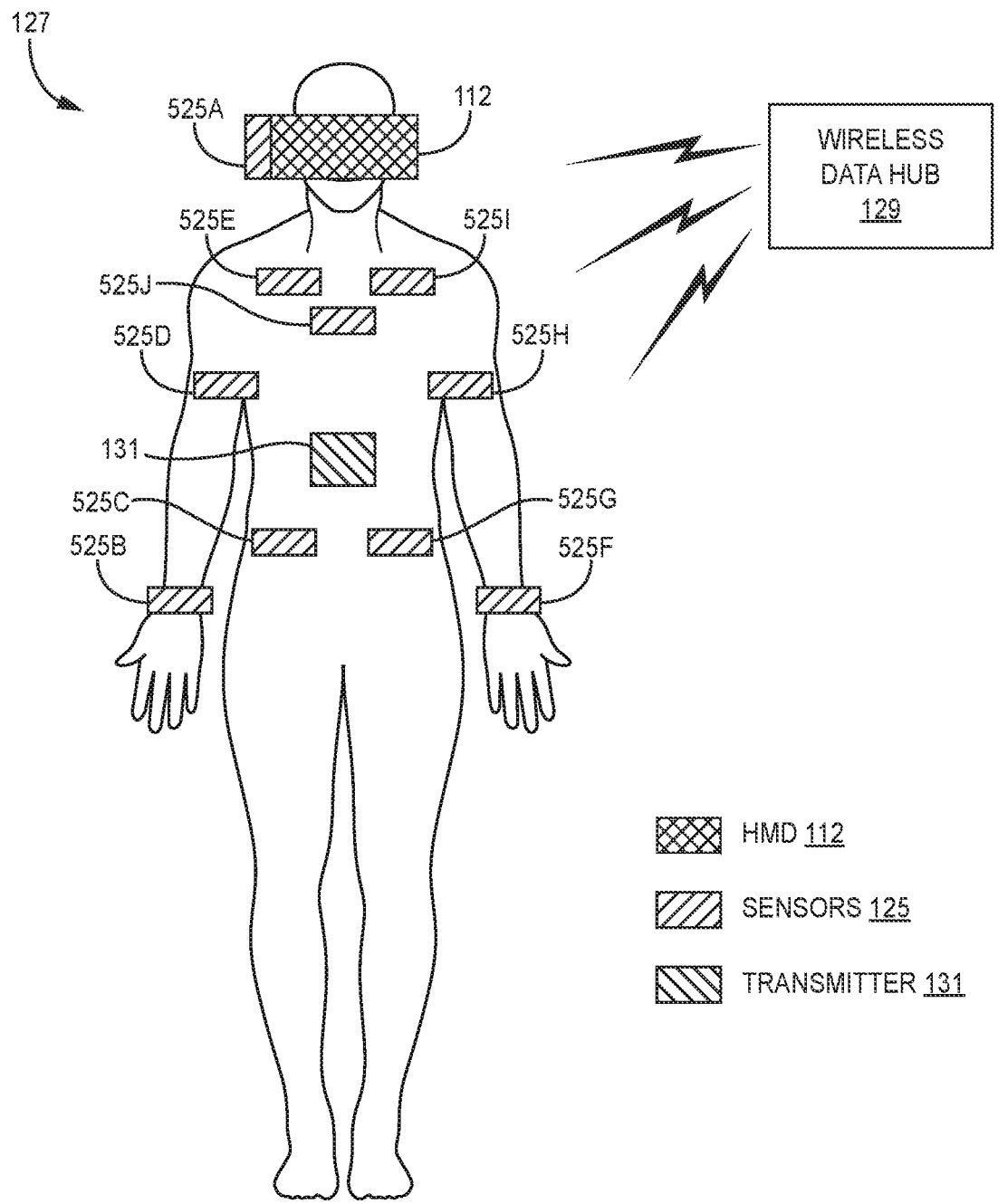
FIG. 5 is an illustration depicting an example configuration of a magnetic sensor system in accordance with the techniques of the disclosure.

FIG. 5 is an illustration depicting an example configuration of magnetic sensor system 127 in accordance with the techniques of the disclosure. Magnetic sensor system 127 includes a plurality of magnetic sensor components 525A-525J (collectively, "magnetic sensor components 525") and magnetic transmitter 131. Magnetic sensor system 127 operates in conjunction with wireless data hub 129 and HMD 112 in a substantially similar fashion as described above with respect to FIG. 1. Each of magnetic sensor components 525 may operate in a substantially similar fashion as magnetic sensor components 125 of FIG. 1.

As depicted in FIG. 5, each magnetic sensor component 525 of magnetic sensor system 127 is spatially arranged so as to position so as to position each magnetic sensor component 525 at a different location of a body of a user. As described in more detail with respect to FIG. 6, one or more wearable articles (not depicted in FIG. 5) may spatially arrange magnetic sensor components 525 and magnetic transmitter 131 by affixing magnetic sensor components 525 and magnetic transmitter 131 at one or more locations of a body of the user, such as a head (e.g., magnetic sensor component 525A), left and right wrists (e.g., magnetic sensor components 525B and 525F), left and right elbows (e.g., magnetic sensor components 525D and 525H), left and right sides of a hip (e.g., magnetic sensor components 525C and 525G), left and right shoulders (e.g., magnetic sensor components 525E and 525I), and upper front center of the torso (e.g., magnetic sensor component 525J). In other examples, magnetic sensor components 525 may be positioned at other locations of the body of the user, such as a forearm, an upper arm, a neck, a torso, a waist, an upper leg, a knee, a lower leg, an ankle, or a foot. As depicted in the example of FIG. 5, each magnetic sensor component 525 is positioned on a location on the body of the user that is different from the location at which magnetic transmitter 131 is positioned on the body of the user and each other magnetic sensor component 525. As described in more detail below, in some examples, one or more wearable articles (e.g., a vest, a shirt, a jacket, arm bands, and/or chest bands) provide structural support for magnetic sensor components 525 and magnetic transmitter 131 to stabilize magnetic sensor components 525. By providing rigid structural support for magnetic sensor components 525 and magnetic transmitter 131, the one or more wearable articles may avoid impeding movement of the user. Furthermore, the rigid structural support provided by the one or more wearable articles may reduce noise in the magnetic sensor data generated by magnetic sensor system 127 that may otherwise occur due to vibration or shifting of a position of the components of magnetic sensor system 127 during movement of the user.

Figure 6:
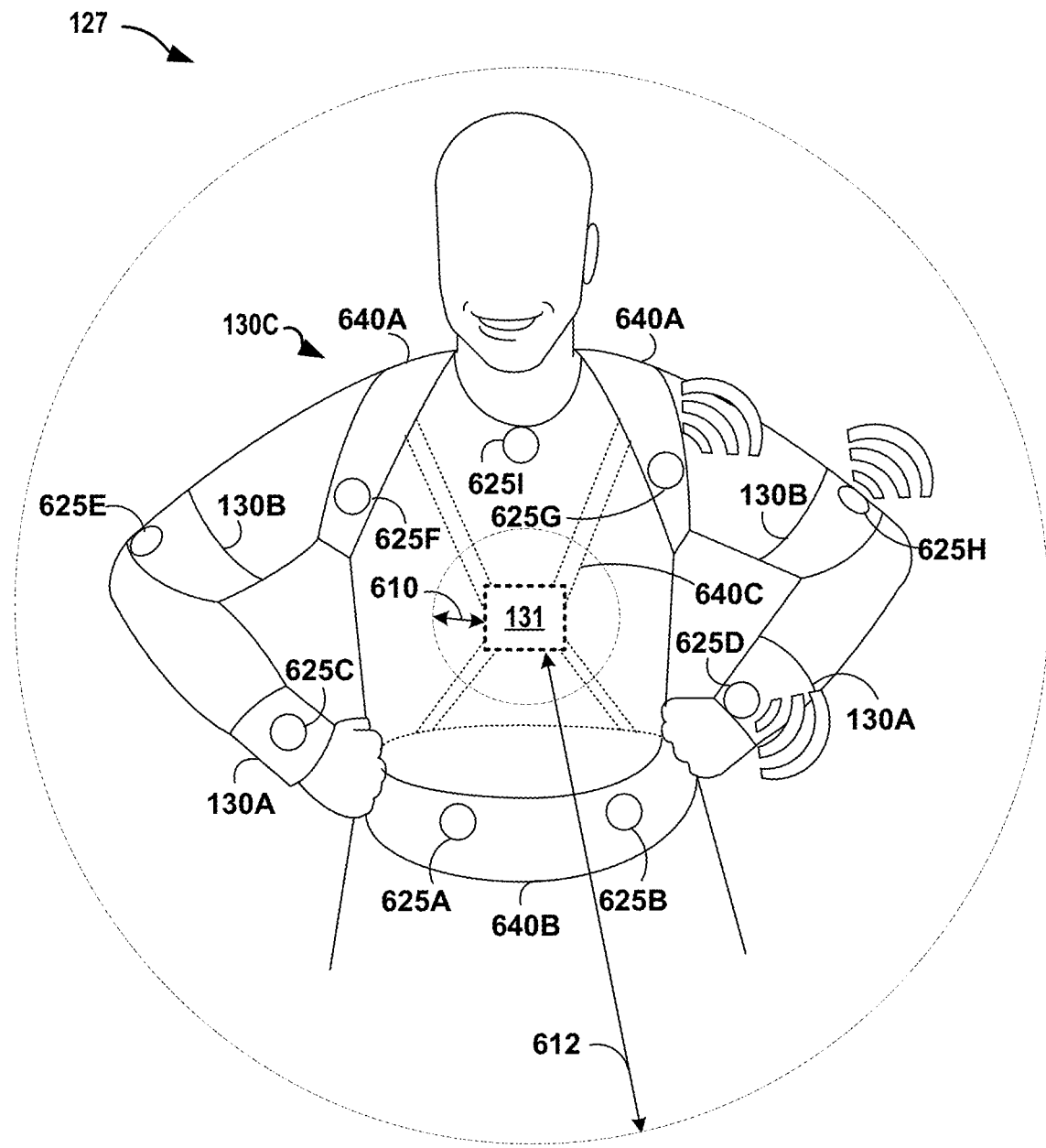
FIG. 6 is an illustration depicting an example spatial arrangement of components within wearable articles of a magnetic sensor system in accordance with the techniques of the disclosure.

FIG. 6 is an illustration depicting an example spatial arrangement of components within wearable articles 130A-130E (hereinafter, "wearable articles 130") of magnetic sensor system 127 in accordance with the techniques of the disclosure. Magnetic sensor system 127 includes a plurality of magnetic sensor components 125 and magnetic transmitter 131. Magnetic sensor system 127 operates in a substantially similar fashion as described above with respect to FIG. 1.

In the example of FIG. 6, a user wears multiple wearable articles 130 that affix multiple magnetic sensor components 625A-625I (collectively, magnetic sensor components 625") and magnetic transmitter 131 around a torso of the user. Each of magnetic sensor components 625 may operate in a substantially similar fashion as magnetic sensor components 125 of FIG. 1. For example, wearable articles 130 may affix each of magnetic sensor components 625 at different body joints of a plurality of different body joints of the user. As depicted in the example of FIG. 6, wearable articles 130 include each of wrist bands 130A, elbow bands 130B, and a harness backpack 130C comprising shoulder harnesses 640A, belt 640B, and rear straps 640C. Each of wrist bands 130A, elbow bands 130B, and shoulder harnesses 640A mount one of magnetic sensor components 625. Belt 640B mounts two magnetic sensor component 625. Further, harness backpack 130C affixes magnetic transmitter 131 at a back of the user (as depicted by the dotted lines of FIG. 6)

via rear straps 640C. Furthermore, harness backpack 130C affixes magnetic sensor components 625I to an upper center of a front torso of the user. Alternatively, a wearable article 130 may affix magnetic transmitter 131 and/or magnetic sensor components 625 at other locations around the torso of the user. Other types of wearable articles may be used in addition to, or in alternative to, wearable articles 130 depicted in FIG. 6.

In some examples, the at least one wearable article is configured to be worn on one or more body parts of the user, such as around a neck, arms, legs, head, torso, or waist of the user, etc. For example, wearable articles 130 may include a backpack with shoulder and hip straps, arm bands, and wrist bands, a jacket, vest, coat, shirt, hat, pants, shoes, a belt, a harness, one or more clips that attach to clothing of the user, or other type of device wearable by the user.

While in the example of FIG. 6, the user wears multiple wearable articles 130, each of which mounts one or more sensors 125, in other examples, the user wears a single wearable article 130 (e.g., a full-body suit or harness) that mounts all of magnetic sensor components 125 and magnetic transmitter 131. For example, a wearable article 130 may comprise a single unit, e.g., a jacket, vest, harness, or backpack, that mounts magnetic transmitter 131 around a torso of the user and a power source (not depicted) on a back of the user. In addition, the single wearable article 130 may spatially arrange a plurality of magnetic sensor components 625 around the torso of the user at locations different from the magnetic transmitter 131, the power source, and each of the other magnetic sensor components 625. The wearable article spatially arranges magnetic sensor components 625 around the torso of the user such that magnetic sensor data obtained from magnetic sensor components 625 may be used for body pose tracking of the user.

Typically, each magnetic sensor component 125 is affixed at a location on the body of the user that is within signal range 612 of the magnetic transmitter. For example, where signal range 612 of magnetic transmitter 131 is approximately 1 meter, each magnetic sensor component 125 is affixed at a location on the body of the user that is within 1 meter of magnetic transmitter 131. Additionally, each magnetic sensor component 125 is affixed at a location on the body of the user that is outside of a noise range 610 at which magnetic transmitter 131 may cause interference to magnetic sensor component 125. For example, magnetic sensor components 125 may receive interference, noise, or otherwise behave in an undesired or unpredictable manner when located less than approximately 10 centimeters from magnetic transmitter 131. Accordingly, each magnetic sensor component 125 is affixed at a location on the body of the user that is at least 10 centimeters away from magnetic transmitter 131. As depicted in the example of FIG. 6, each magnetic sensor component 125 is affixed at a location on the body of the user that is outside of noise range 610 and inside of signal range 612. For example, each of magnetic sensor components 125 is affixed at a location on the body of the user that is more than about 10 centimeters and less than about 1 meter from the location at which magnetic transmitter 131 is affixed at the body of the user.

Each wearable article may affix a magnetic sensor component 125, magnetic transmitter 131, or a power source (not depicted in FIG. 6) via various types of attachment devices integrated into wearable articles 130. For example, harness 130C includes a transmitter attachment mechanism configured to affix magnetic transmitter 131 at a location on the torso of the user. For example, harness 130 may include sewn fabric that encapsulates magnetic transmitter 131 on a back of the user (as depicted by the dashed lines of magnetic transmitter 131 in FIG. 7) and one or more rear straps 640C that position magnetic transmitter 131 at a location on the torso of the user.

Each of wearable articles 130A, 130B, and 130C include at least one receiver attachment mechanism spatially arranged within the respective wearable article 130 that affixes one or more magnetic sensor components 125 at respective different locations around the torso of the user. In examples where a wearable article 130 includes a power source or battery (not depicted in FIG. 6), wearable article 130 may include a power source attachment mechanism configured to affix the power source at a location on the torso of the user that is different than the location of magnetic transmitter 131 and the locations of each of the plurality of magnetic sensor components 125. Various types of attachment mechanisms may be used to affix the various components of magnetic sensor system 127 at positions on the body of the user. For example, wearable articles 130 may include one or more hook-and-loop fasteners, clips, sewn pockets, button fasteners, ties, clasps, straps, or laces. For example, each wearable article 130 may include a sewn loop of elastic fabric that anchors the various components of magnetic sensor system 127 to the wearable article 130.

Each of the transmitter attachment mechanism, receiver attachment mechanisms, and the power source attachment mechanism may be similar or different types of attachment mechanisms. Further, each attachment mechanism may be permanent or removable. For example, the transmitter attachment mechanism or receiver attachment mechanism may enclose magnetic transmitter 131 or one of magnetic sensor components 125 in a permanent, sewn enclosure of a wearable device 130. As another example, each of the transmitter attachment mechanism or receiver attachment mechanism may be a removable fastener that facilitates convenient removal and replacement of one of magnetic transmitter 131 or magnetic sensor components 125.

FIGS. 7A-7D are illustrations depicting example wearable articles 130 of a magnetic sensor system 127 from different views in accordance with the techniques of the disclosure. Specifically, FIGS. 7A-7D depict wearable articles 130 of FIG. 6 in different poses from different perspectives. As can be seen in this depiction, a backpack wearable component 130E has affixed thereto magnetic transmitter 131 located at the lower back of the user and power source 604 (e.g., a battery component) located between the shoulder blades.

Each wearable article 130 comprises a relatively rigid structure that stabilizes magnetic sensor components 125 without inhibiting movement by the user. In addition, each wearable article 130 may be constructed to hold the components of magnetic sensor system 127, such as magnetic sensor components 125, magnetic transmitter 131, and battery component 604, on the user's body with appropriate weight distribution to facilitate user comfort. For example, wearable article 130E affixes the magnetic transmitter 131 at a position close to a center of a mass of the user, such as at a position at the small of the back of a user, so as to reduce discomfort and fatigue in the user. In some examples, wearable articles 130 are constructed from a strong material that is form-fitting to a skin of the user, such as silicone. In some examples, wearable articles 130 include a silicone supportive member that rests against a skin of the user. The wearable articles 130 further include an elastic synthetic fabric that attaches to the silicone supportive member and provides a mechanism to hold the components of magnetic sensor system 127.

Figure 7A:
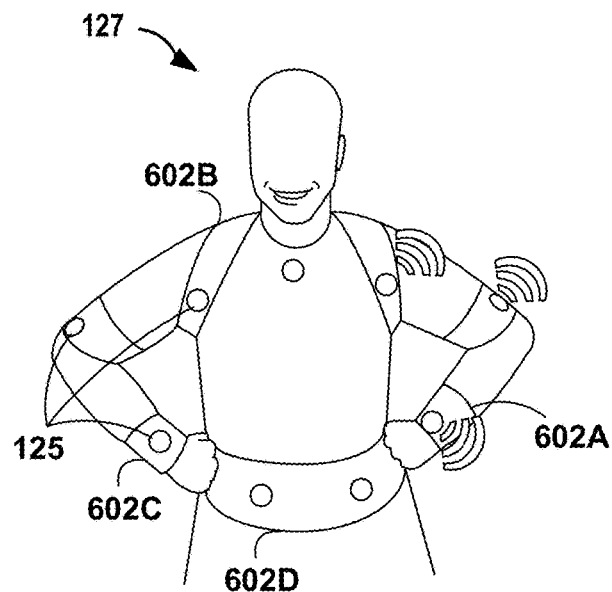
FIGS. 7A-7D are illustrations depicting example wearable articles of a magnetic sensor system from different views in accordance with the techniques of the disclosure.
Figure 7B:
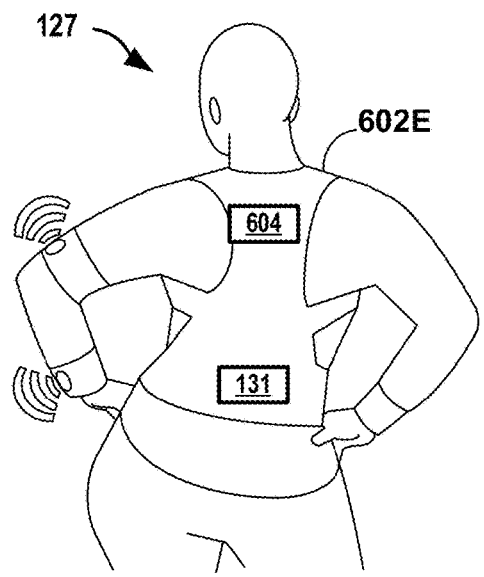
Figure 7C:
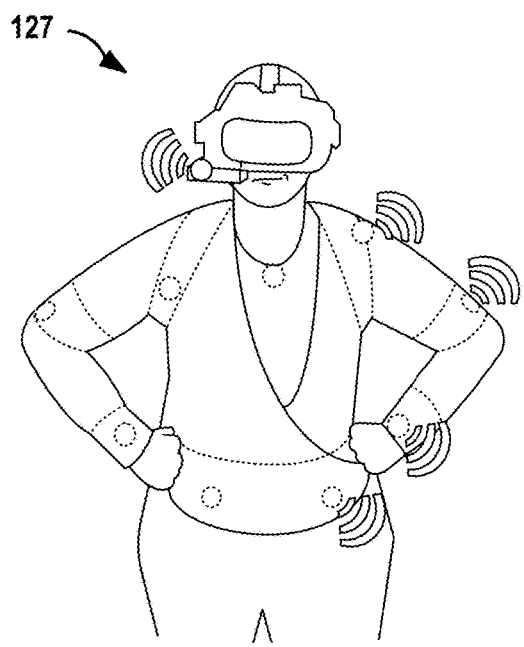
Figure 7D:
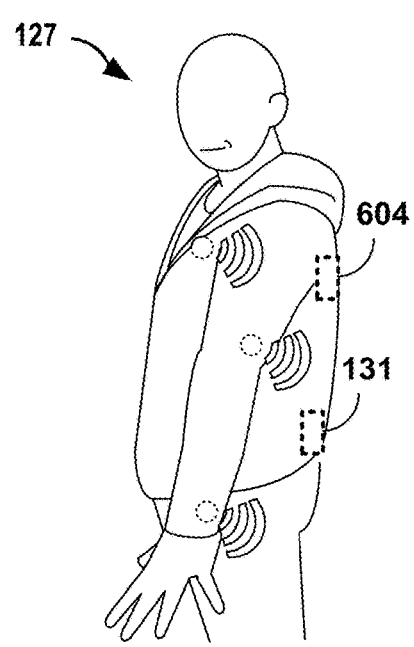

As depicted in FIGS. 7C and 7D, magnetic sensor components 125 are small and may be hidden underneath the clothes of the user without introducing visual bias to image capture devices during data collection. Magnetic sensor data may be processed to determine an orientation and position of the corresponding magnetic sensor components 125, with little or no affect by line-of-sight considerations, in contrast to conventional techniques that use infrared or visible light tracking. As discussed in more detail below with respect to FIG. 8, the magnetic sensor system 172 of FIG. 7C may include at least one magnetic sensor components 125 incorporated into an HMD.

Figure 8:
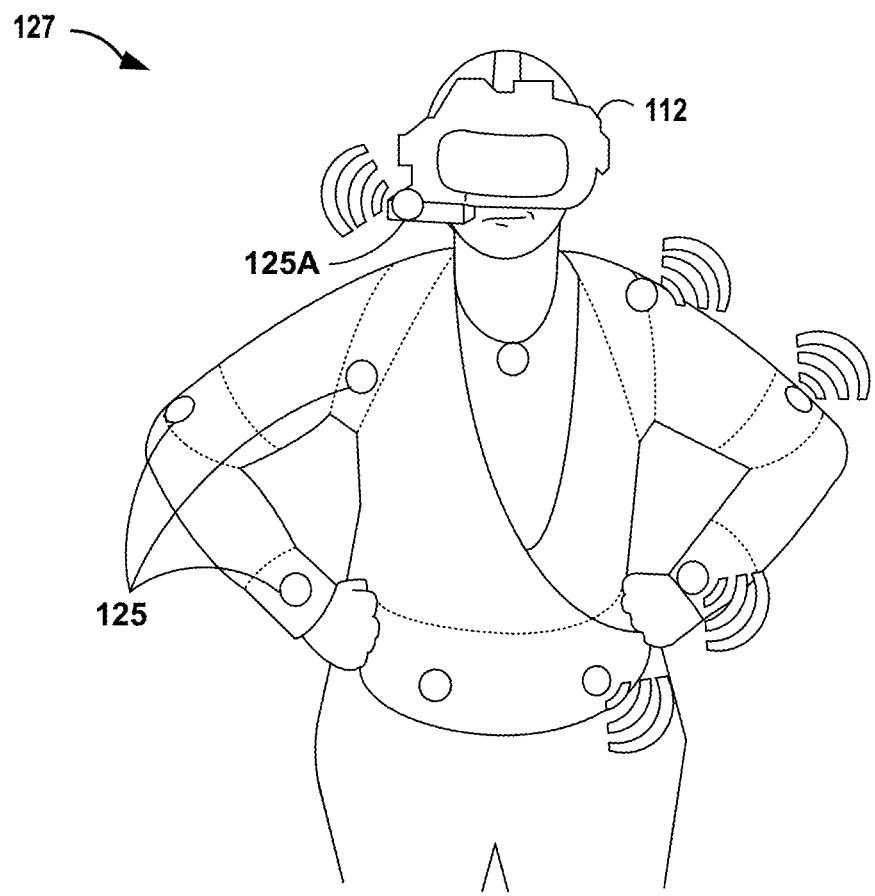
FIG. 8 is an illustration depicting example configurations of magnetic sensors in a magnetic sensor system in accordance with the techniques of the disclosure.

FIG. 8 is an illustration depicting example wearable articles 130 that include magnetic sensor system 127 and HMD 112 in accordance with the techniques of the disclosure. In the example of FIG. 8, HMD 112 may additionally include a magnetic sensor component 125A that operates in a substantially similar fashion as magnetic sensor components 125. In one example, magnetic sensor component 125A is connected to HMD 112 via a wired connection, while the other magnetic sensor component 125 are connected to HMD 112 via wireless connections. In some examples, magnetic sensor component 125A may be a "main" magnetic sensor component that coordinates timing synchronization with each other magnetic sensor component 125 of magnetic sensor system 127. For example, magnetic sensor components 125 and 125A may operate in conjunction with one another to generate magnetic sensor data and wirelessly send the magnetic sensor data to data hub 129 of FIG. 1. In some examples, magnetic sensor component 125A performs periodic timing synchronization with each other magnetic sensor component 125 of magnetic sensor system 127. In some examples, the wireless link between each of magnetic sensor component 125 and magnetic sensor component 125A is on a different wireless channel to minimize wireless link packet drop. In some examples, magnetic sensor component 125A broadcasts a synchronization signal to each of magnetic sensor components 125. Magnetic sensor component 125A may transmit the synchronization signal to magnetic sensor components 125 using a wireless communication protocol, such as Bluetooth®, IEEE 802.11, etc.

Image data provided by an image capture device of HMD 112 may be used to provide a "ground truth" to validate or verify the determined locations of magnetic sensor components 125. For example, a location of a body part of the user depicted in the image data may be used to verify a detected location of a corresponding magnetic sensor 125 affixed at the body part. By fusing the magnetic sensor data with the image data, pose tracker 326 may perform pose tracking of the user that is robust to many forms of noise and exhibits a high degree of accuracy.

Figure 9A:
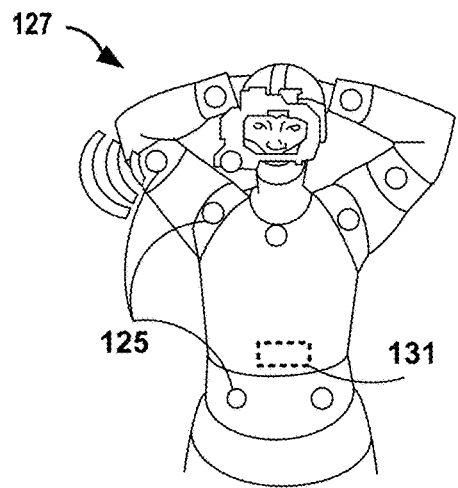
FIGS. 9A-9D are illustrations depicting example postures of a user that are detectable via magnetic sensor-based body pose tracking performed in accordance with the techniques of the disclosure.
Figure 9B:
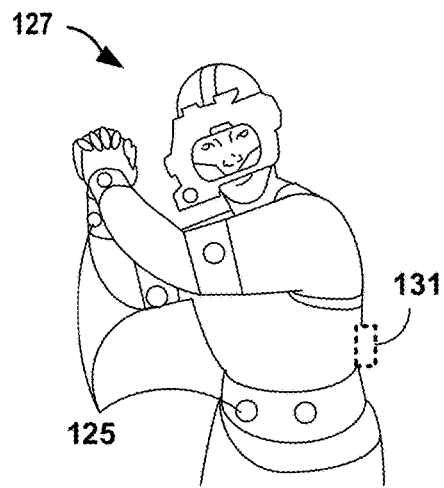
Figure 9C:
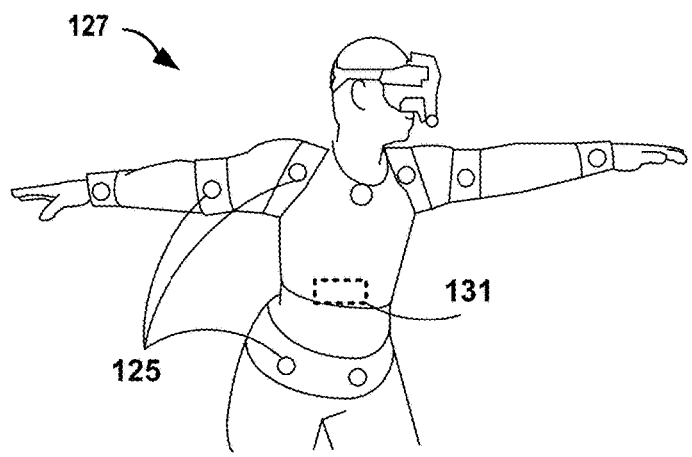
Figure 9D:
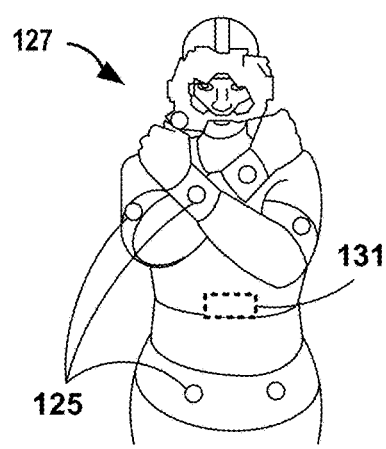

FIGS. 9A-9D are illustrations depicting example postures of a user that are detectable via magnetic sensor-based body pose tracking performed in accordance with the techniques of the disclosure. For example, FIG. 9A depicts a user holding her arms behind her head. FIG. 9B depicts a user assuming a "batting" stance, such as used in the game of baseball. FIG. 9C depicts a user assuming a yoga pose. FIG. 9D depicts a user assuming a blocking pose with both arms. As described above, a user wears one or more wearable articles that affix magnetic sensor system 127 at a body of the user. The poses depicted in FIGS. 9A-9D are provided for illustrative purposes only, and the techniques of the disclosure are able to detect other postures or poses of the user not expressly depicted in FIGS. 9A-9D. Magnetic transmitter 131 of magnetic sensor system 127 generates a magnetic field. Each magnetic sensor component 125 of magnetic sensor system 127 generates magnetic sensor data from the sensed magnetic field. Magnetic sensor component 125 wirelessly transmit the magnetic sensor data to wireless hub 129 for pose tracking.

As described above with respect to FIG. 3, magnetic sensor-based pose tracker 327 may use the magnetic sensor data to compute a position of each of magnetic sensor components 125. For example, each magnetic sensor component 125 includes a 3-axis magnetic sensor. The magnetic sensor data that each magnetic sensor component 125 generates includes, e.g., values along x, y, and z directions of a strength of the magnetic field generated by magnetic transmitter 131 and sensed by the respective magnetic sensor component 125. The strength of the sensed magnetic field along each of the three axes varies according to both a distance and an orientation of the magnetic sensor component 125 with respect to magnetic transmitter 131. Magnetic sensor-based pose tracker 327 computes, based on the changes in the magnetic sensor data, changes in a position of each of magnetic sensor components 125. Further, magnetic sensor-based pose tracker 327 computes, based on the position of each of magnetic sensor components 125 with respect to a pre-defined skeletal model, a pose of the user.

In some examples, each magnetic sensor component 125 computes a location and orientation of the magnetic sensor component 125 based on magnetic sensor generated by the 3-axis magnetic sensor. Each magnetic sensor component 125 may increase the accuracy of the computed location and orientation by using other types of data in conjunction with the magnetic sensor data, such as IMU data, such as raw accelerometer data, gyroscope or rotational speed data, or a sensed strength of the Earth's magnetic field. In these examples, each magnetic sensor component 125 outputs a computed sensor position (e.g., a location and orientation of the magnetic sensor component 125) to, e.g., HMD 112 of FIG. 1.

Each of the poses assumed by the use in FIGS. 9A-9D may be difficult for conventional image-based or IMU-based pose tracking systems to detect. For example, as depicted in in FIGS. 9A-9D, in each of the poses, the arms of the user are outside of a field of view of an image capture device of the HMD (e.g., FIGS. 9A-9C), or one arm of the user occludes the other arm of the user (e.g., FIG. 9D). Therefore, an image-based pose tracking system may be unable to accurately detect a pose of the user in each of FIGS. 9A-9D.

A magnetic sensor system as described herein may perform pose tracking of a user with a high degree of robustness that may not be possible with IMU-based or image-based pose tracking systems alone. For example, even without post processing, a magnetic sensor system as disclosed herein can achieve high accuracy key point tracking with low jitters. A magnetic sensor system as described herein can generate ground truth data even with occlusion, and may be immune to variance of lighting conditions. Further, such a system as described herein can be totally mobile such that a user may wear the system easily and move freely between different environments. Such a magnetic sensor system may, e.g., permit a user to move from indoors to outdoors without interrupting data collection.

Figure 10:
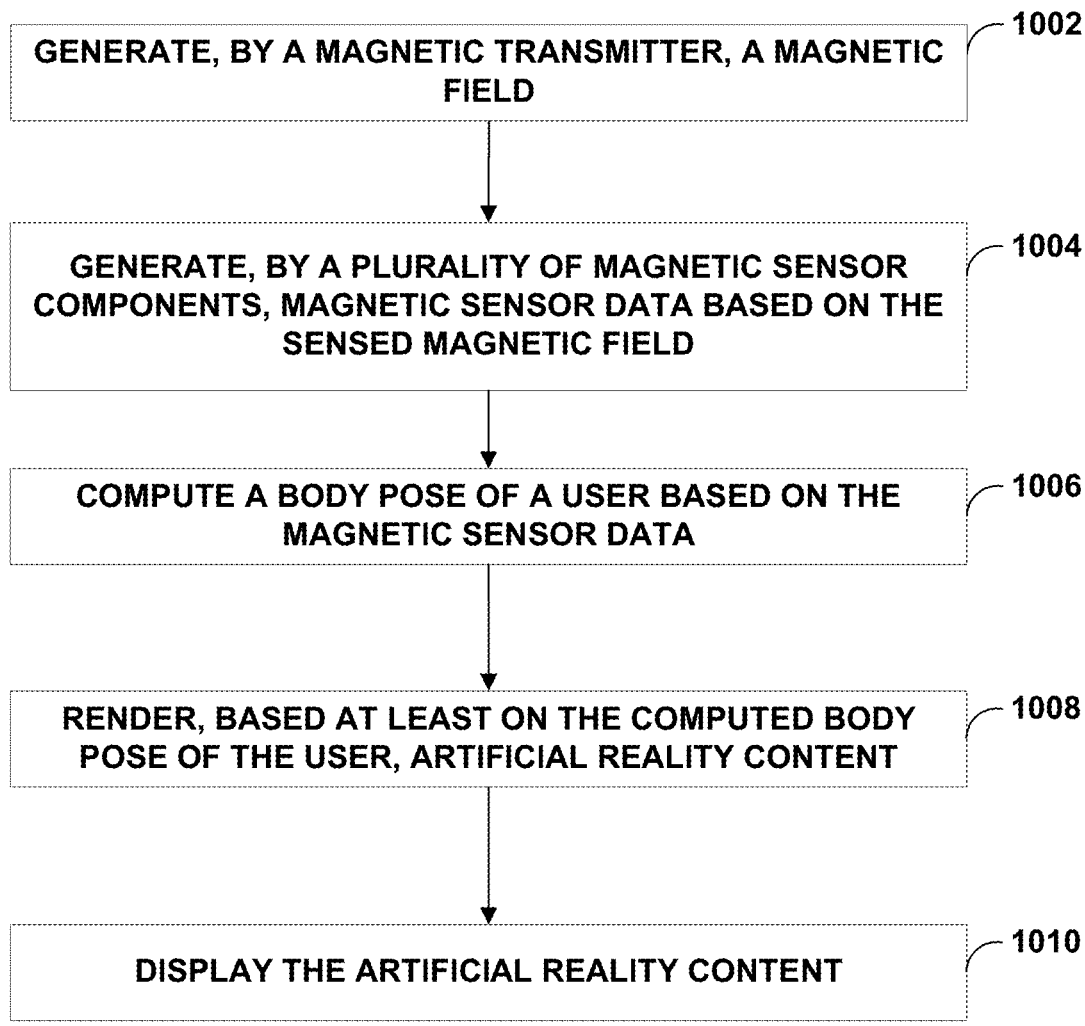
FIG. 10 is a flowchart depicting an example operation for performing magnetic sensor-based body pose tracking in accordance with the techniques of the disclosure.

FIG. 10 is a flowchart depicting an example operation for performing magnetic sensor-based body pose tracking in accordance with the techniques of the disclosure. For convenience, FIG. 10 is described with respect to the system of FIG. 3. However, the operation of FIG. 10 may be performed by other systems in accordance with the techniques of the disclosure, such as by the system of FIG. 4.

As depicted in the example of FIG. 4, a user wears one or more wearable articles that provide structural support for magnetic sensor system 127 that includes magnetic transmitter 131 and a plurality of magnetic sensor components 125. Each component of magnetic sensor system 127 is positioned on a different location of a body of a user Magnetic transmitter 131 generates a magnetic field (1002). A plurality of magnetic sensor components 125 generate magnetic sensor data based on the sensed magnetic field (1004). Each of the plurality of magnetic sensor components 125 wirelessly transmit the magnetic sensor data to hub 129 for body pose tracking.

Magnetic pose tracker 327 computes a body pose of a user based on the magnetic sensor data (1006). For example, magnetic sensor-based pose tracker 327 maintains a predefined skeletal model that maps respective locations of each magnetic sensor component 125 to the body of the user. Magnetic sensor-based pose tracker 327 uses the magnetic sensor data obtained from each one of magnetic sensor components 125 to determine a position of each of magnetic sensor components 125 with respect to one or more body parts or joints of the predefined skeletal model. Magnetic sensor-based pose tracker 327 computes, based on the magnetic sensor data, at least one of a translation or a rotation of each magnetic sensor component 125 with respect to a body joint of the predefined skeletal model. Magnetic sensor-based pose tracker 327 uses the computed location of magnetic sensor components 125 on the body of the user to compute the body pose of the user. For example, by assuming that each magnetic sensor component 125 is affixed at a corresponding joint or body part of the user, magnetic sensor-based pose tracker 327 may use magnetic sensor data to identify a change in position of a magnetic sensor unit 125 and equate the change in position of the body part at which the magnetic sensor unit 125 is affixed.

Rendering engine 322 renders, based at least on the computed body pose of the user, artificial reality content (1008). For example, rendering engine 322 constructs the artificial reality content for display to user 110 in accordance with current pose information for a frame of reference, typically a viewing perspective of HMD 112, as determined by pose tracker 326. Based on the current viewing perspective, rendering engine 322 constructs the 3D, artificial reality content which may be overlaid, at least in part, upon the physical 3D environment in which user device 300 is located. A display device displays the artificial reality content to a user (1010). The user may be one of users 110 and 112 of FIG. 1. The display device may be, for example, a display of user device 118 of FIG. 1 or one of the HMDs 112 depicted in FIG. 1A-1B or 2A-2B.

The techniques described in this disclosure may be implemented, at least in part, in hardware, software, firmware or any combination thereof. For example, various aspects of the described techniques may be implemented within one or more processors, including one or more microprocessors, DSPs, application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs). The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

What is claimed is:

1. A wearable magnetic sensor system comprising:
 a wearable article configured to be worn around a torso of a user;
 a magnetic transmitter configured to generate a magnetic field;
 a plurality of magnetic sensor components, wherein each magnetic sensor component of the plurality of magnetic sensor components comprises:
  a magnetic sensor configured to generate magnetic sensor data based on the magnetic field sensed at the magnetic sensor and wirelessly transmit the magnetic sensor data to a pose tracker; and
 the pose tracker, wherein the pose tracker is configured to:
  calibrate, based on a model of magnetic distortion and noise over a body of the user, the magnetic sensor of each magnetic sensor component of the plurality of magnetic sensor components; and
compute a body pose of the user based on the magnetic sensor data of each magnetic sensor component of the plurality of magnetic sensor components,
wherein the wearable article includes a transmitter attachment mechanism configured to affix the magnetic transmitter at a location on the torso of the user, and
wherein the wearable article includes a plurality of receiver attachment mechanisms spatially arranged within the wearable article to affix each magnetic sensor component of the plurality of magnetic sensor components at respective different locations around the torso of the user.

2. The system of claim 1,
wherein each magnetic sensor of each magnetic sensor component of the plurality of magnetic sensor components comprises a three-axis magnetic sensor configured to generate the magnetic sensor data, and
wherein the magnetic sensor data comprises values indicative of a strength of the magnetic field sensed at the magnetic sensor along each of three axes.

3. The system of claim 1, wherein the plurality of receiver attachment mechanisms are spatially arranged within the wearable article to position the plurality of magnetic sensor components around the torso of the user such that the magnetic sensor data generated by the plurality magnetic sensor components comprises tracking data for movements of the torso of the user.

4. The system of claim 1, wherein the plurality of receiver attachment mechanisms are spatially arranged within the wearable article to position the plurality of magnetic sensor components around the torso of the user such that each magnetic sensor component of the plurality of magnetic sensor components is a distance from the transmitter that is within a signal range of the magnetic transmitter and outside of a range at which the magnetic transmitter causes interference to the respective magnetic sensor component.

5. The system of claim 1, wherein the transmitter attachment mechanism comprises at least one of a hook-and-loop fastener, a clip, a sewn pocket, a button fastener, a tie, a clasp, a strap, or a lace configured for removeable attachment of the magnetic transmitter.

6. The system of claim 1, wherein each of the plurality of receiver attachment mechanisms comprises at least one of a hook-and-loop fastener, a clip, a sewn pocket, a button fastener, a tie, a clasp, a strap, or a lace configured for removeable attachment of a respective magnetic sensor component of the plurality of magnetic sensor components.

7. The system of claim 1,
wherein the transmitter attachment mechanism is integrated into the wearable article, and
wherein the plurality of receiver attachment mechanisms are integrated into the wearable article.

8. The system of claim 1, wherein the plurality of receiver attachment mechanisms are spatially arranged within the wearable article to position each magnetic sensor component of the plurality of magnetic sensor components at a different body joint of the user.

9. The system of claim 1,
wherein the wearable article comprises a first wearable article,
wherein the system further comprises a second wearable article configured to be worn around a portion of a body of the user other than the torso, and
wherein the second wearable article includes at least one receiver attachment mechanism within the second wearable article to affix at least one magnetic sensor component of the plurality of magnetic sensor components at a location on the portion of the body of the user other than the torso.

10. The system of claim 9, wherein the second wearable article comprises a wrist band configured to be worn around a wrist of the user.

11. The system of claim 1, wherein the wearable article comprises a vest configured to be worn around a back, chest, or shoulders of the user.

12. The system of claim 1, wherein the at least one wearable article comprises a rigid stabilizing structure configured to stabilize the plurality of magnetic sensor components without inhibiting movement by the user.

13. The system of claim 12, wherein the rigid stabilizing structure comprises:
at least one silicone supportive member form-fitted to a skin of the user; and
at least one elastic synthetic fabric configured to secure the plurality of magnetic sensor components to the at least one silicone supportive member.

14. The system of claim 1, wherein the transmitter attachment mechanism and the plurality of receiver attachment mechanisms are spatially arranged within the wearable article to distribute a weight of the magnetic transmitter and the plurality of magnetic sensor components to facilitate user comfort.

15. The system of claim 1, further comprising:
a power source operatively coupled to the magnetic transmitter and each magnetic sensor component of the plurality of magnetic sensor components,
wherein the wearable article includes a power source attachment mechanism configured to affix the power source at a location on the torso of the user that is different than the location of the magnetic transmitter and the locations of the plurality of magnetic sensor components.

16. The system of claim 1,
wherein each magnetic sensor component of the plurality of magnetic sensor components further comprises an inertial measurement unit (IMU) configured to generate IMU data and wirelessly transmit the IMU data to the pose tracker,
wherein the pose tracker is further configured to calibrate, based on a model of IMU distortion and noise over the body of the user, the IMU of each magnetic sensor component of the plurality of magnetic sensor components; and
wherein to compute the body pose of the user, the pose tracker is further configured to compute the body pose of the user based on the magnetic sensor data and the IMU data of each magnetic sensor component of the plurality of magnetic sensor components.

17. A wearable magnetic sensor system comprising:
a wearable article configured to be worn around a torso of a user;
a magnetic transmitter configured to generate a magnetic field;
a plurality of magnetic sensor components, wherein each magnetic sensor component of the plurality of magnetic sensor components comprises:
a magnetic sensor configured to generate magnetic sensor data based on the magnetic field sensed at the magnetic sensor and wirelessly transmit the magnetic sensor data to a pose tracker; and an inertial measurement unit (IMU) configured to generate IMU data and wirelessly transmit the IMU data to the pose tracker, wherein the wearable article includes a transmitter attachment mechanism configured to affix the magnetic transmitter at a location on the torso of the user, wherein the wearable article includes a plurality of receiver attachment mechanisms spatially arranged within the wearable article to affix each magnetic sensor component of the plurality of magnetic sensor components at respective different locations around the torso of the user; and the pose tracker, wherein the pose tracker is configured to:
calibrate, based on a first model of magnetic distortion and noise over a body of the user, the magnetic sensor of each magnetic sensor component of the plurality of magnetic sensor components;
calibrate, based on a second model of IMU distortion and noise over the body of the user, the IMU of each magnetic sensor component of the plurality of magnetic sensor components; and
compute a body pose of the user based on the magnetic sensor data and IMU data of each magnetic sensor component of the plurality of magnetic sensor components.

18. The system of claim 1, further comprising a head-mounted display (HMD) comprising an image capture device configured to generate image data,
wherein to compute the body pose of the user, the pose tracker is further configured to compute, based on the magnetic sensor data of each magnetic sensor component of the plurality of magnetic sensor components and the image data of the image capture device of the HMD, the body pose of the user.

19. The system of claim 18, wherein the pose tracker is further configured to calibrate the magnetic sensor of each magnetic sensor component of the plurality of magnetic sensor components based on the image data of the image capture device of the HMD.

20. The system of claim 1, further comprising a computer vision-based body capture system configured to generate body data of the user,
wherein the pose tracker is further configured to calibrate the magnetic sensor of each magnetic sensor component of the plurality of magnetic sensor components based on the body data of the computer vision-based body capture system.

21. The system of claim 17, further comprising a head-mounted display (HMD) comprising an image capture device configured to generate image data,
wherein to compute the body pose of the user, the pose tracker is further configured to compute, based on the magnetic sensor data and IMU data of each magnetic sensor component of the plurality of magnetic sensor components and the image data of the image capture device of the HMD, the body pose of the user.

22. The system of claim 17, further comprising a rendering engine configured to render, based at least on the computed body pose of the user, artificial reality content for display by one or more display devices.

23. The system of claim 22, wherein to compute the position of each magnetic sensor component of the plurality of magnetic sensor components on the body of the user, the pose tracker is configured to compute, from a corresponding body joint of a plurality of body joints of a predefined skeletal model, at least one of:
a translation from the corresponding body joint of the plurality of body joints of the predefined skeletal model; or
a rotation from the corresponding body joint of the plurality of body joints of the predefined skeletal model.

24. The system of claim 17, wherein, to compute the body pose of the user based on the magnetic sensor data, the pose tracker is configured to:
compute, based on the magnetic sensor data, a position of each magnetic sensor component of the plurality of magnetic sensor components on a body of the user; and
compute, based on the computed position of each magnetic sensor component of the plurality of magnetic sensor components on the body of the user, the body pose of the user.

25. A method comprising:
generating, by a magnetic transmitter of a wearable magnetic sensor system, a magnetic field, wherein the wearable magnetic sensor system comprises a wearable article configured to be worn around a torso of a user, and wherein the wearable article includes a transmitter attachment mechanism configured to affix the magnetic transmitter at a location on the torso of the user, and a plurality of receiver attachment mechanisms spatially arranged within the wearable article to affix each magnetic sensor component of a plurality of magnetic sensor components at respective different locations around the torso of the user;
generating, by a magnetic sensor of each magnetic sensor component of the plurality of magnetic sensor components, magnetic sensor data based on the magnetic field sensed at the magnetic sensor;
wirelessly transmitting, by the magnetic sensor, the magnetic sensor data to a pose tracker;
calibrating, by the pose tracker and based on a model of magnetic distortion and noise over a body of the user, the magnetic sensor of each magnetic sensor component of the plurality of magnetic sensor components; and
computing, by the pose tracker, a body pose of the user based on the magnetic sensor data of each magnetic sensor component of the plurality of magnetic sensor components.

* * * * *